(12) United States Patent  
Yoshihara et al.

(10) Patent No.: US 12,424,514 B2
(45) Date of Patent: *Sep. 23, 2025

(54) POWER MODULE APPARATUS, COOLING STRUCTURE, AND ELECTRIC VEHICLE OR HYBRID ELECTRIC VEHICLE

(71) Applicant: ROHM CO., LTD., Kyoto (JP)

(72) Inventors: Katsuhiko Yoshihara, Kyoto (JP); Masao Saito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/505,325

(22) Filed: Nov. 9, 2023

(65) Prior Publication Data

US 2024/0079293 A1 Mar. 7, 2024

Related U.S. Application Data

(63) Continuation of application No. 17/114,020, filed on Dec. 7, 2020, now Pat. No. 11,854,937, which is a  
(Continued)

(30) Foreign Application Priority Data

Dec. 4, 2015 (JP) ................................ 2015-237458

(51) Int. Cl.  
*H01L 23/473* (2006.01)  
*B60K 1/00* (2006.01)  
(Continued)

(52) U.S. Cl.  
CPC .............. *H01L 23/473* (2013.01); *B60K 1/00* (2013.01); *B60K 11/02* (2013.01); *F28F 3/04* (2013.01);  
(Continued)

(58) Field of Classification Search  
CPC .......................... H01L 23/3672; H01L 23/473  
See application file for complete search history.

(56) References Cited

U.S. PATENT DOCUMENTS 3,930,114 A 12/1975 Hodge  
4,157,611 A 6/1979 Ohwaki et al.  
(Continued)

FOREIGN PATENT DOCUMENTS

CN 108231714 A * 6/2018  
DE 102012200863 9/2012  
(Continued)

OTHER PUBLICATIONS

International Search Report and Written Opinion, International Patent Application No. PCT/JP2016/080658, Dec. 27, 2016, with English translation of Search Report (11 pages).  
(Continued)

*Primary Examiner* — David A Zarneke  
(74) *Attorney, Agent, or Firm* — HSML P.C.

(57) ABSTRACT

A power module apparatus includes a power module having a package configured to seal a perimeter of a semiconductor device, and a heat radiator bonded to one surface of the package; a cooling device having a coolant passage through which coolant water flows, in which the heat radiator is attached to an opening provided on a way of the coolant passage, wherein the heat radiator of the power module is attached to the opening of the cooling device so that a height (ha) and a height (hb) are substantially identical to each other. The power module in which the heat radiator is attached to the opening formed at the upper surface portion of the cooling device can also be efficiently cooled, and thereby it becomes possible to reduce degradation due to overheating.

21 Claims, 31 Drawing Sheets

Related U.S. Application Data continuation of application No. 16/511,696, filed on Jul. 15, 2019, now Pat. No. 11,011,454, which is a continuation of application No. 15/997,195, filed on Jun. 4, 2018, now Pat. No. 10,403,561, which is a continuation of application No. PCT/JP2016/080658, filed on Oct. 17, 2016.

(51) Int. Cl.
| | |
|---|---|
| *B60K 11/02* | (2006.01) |
| *F28F 3/04* | (2006.01) |
| *H01L 23/10* | (2006.01) |
| *H01L 23/367* | (2006.01) |
| *H01L 23/495* | (2006.01) |
| *H01L 23/498* | (2006.01) |
| *H01L 25/07* | (2006.01) |
| *H01L 25/18* | (2023.01) |
| *H02M 7/00* | (2006.01) |
| *H05K 7/20* | (2006.01) |
| *B60K 6/22* | (2007.10) |
| *H01L 23/00* | (2006.01) |
| *H01L 25/16* | (2023.01) |
| *H02M 1/32* | (2007.01) |
| *H02M 7/5387* | (2007.01) |
| *H10D 12/00* | (2025.01) |
| *H10D 30/66* | (2025.01) |
| *H10D 62/832* | (2025.01) |
| *H10D 84/00* | (2025.01) |

(52) U.S. Cl.
CPC ........ *H01L 23/10* (2013.01); *H01L 23/49541* (2013.01); *H01L 23/49548* (2013.01); *H01L 23/49551* (2013.01); *H01L 23/49555* (2013.01); *H01L 23/49838* (2013.01); *H01L 25/072* (2013.01); *H01L 25/18* (2013.01); *H02M 7/003* (2013.01); *H05K 7/2089* (2013.01); *H05K 7/209* (2013.01); *H05K 7/20927* (2013.01); *B60K 2001/003* (2013.01); *B60K 6/22* (2013.01); *B60Y 2200/91* (2013.01); *B60Y 2200/92* (2013.01); *F28F 2230/00* (2013.01); *H01L 23/3672* (2013.01); *H01L 24/32* (2013.01); *H01L 25/165* (2013.01); *H01L 2224/32245* (2013.01); *H01L 2224/49113* (2013.01); *H01L 2924/10272* (2013.01); *H01L 2924/1203* (2013.01); *H01L 2924/13055* (2013.01); *H01L 2924/13091* (2013.01); *H01L 2924/14252* (2013.01); *H01L 2924/19041* (2013.01); *H01L 2924/19105* (2013.01); *H02M 1/327* (2021.05); *H02M 7/5387* (2013.01); *H10D 12/441* (2025.01); *H10D 30/66* (2025.01); *H10D 30/668* (2025.01); *H10D 62/8325* (2025.01); *H10D 84/143* (2025.01); *Y10S 903/904* (2013.01)

(56) References Cited

U.S. PATENT DOCUMENTS

| | | | |
|---|---|---|---|
| 4,340,902 A | 7/1982 | Honda et al. | |
| 4,611,238 A | 9/1986 | Lewis et al. | |
| 5,289,344 A | 2/1994 | Gagnon et al. | |
| 5,586,004 A | 12/1996 | Green et al. | |
| 5,703,752 A | 12/1997 | Woo | |
| 6,208,513 B1 | 3/2001 | Fitch et al. | |
| 7,081,670 B2 | 7/2006 | Shibuya et al. | |
| 7,215,012 B2 | 5/2007 | Harnden et al. | |
| 7,449,780 B2 | 11/2008 | Hua et al. | |
| 7,977,776 B2 | 7/2011 | Galera et al. | |
| 8,680,666 B2 | 3/2014 | Hauenstein | |
| 9,134,076 B2 | 9/2015 | Yoshihara et al. | |
| 9,202,765 B2 | 12/2015 | Wang | |
| 9,812,377 B2 * | 11/2017 | Yamada | H01L 23/473 |
| 9,892,992 B2 | 2/2018 | Sanda et al. | |
| 10,431,538 B2 | 10/2019 | Kucharski et al. | |
| 10,553,523 B2 | 2/2020 | Kamiyama | |
| 10,622,287 B2 | 4/2020 | Kogawa et al. | |
| 11,211,320 B2 | 12/2021 | Milo et al. | |
| 11,552,006 B2 | 1/2023 | Koduri | |
| 11,848,252 B2 * | 12/2023 | Gradinger | H01L 21/4882 |
| 11,854,937 B2 * | 12/2023 | Yoshihara | H02M 7/003 |
| 2002/0063328 A1 | 5/2002 | Baek et al. | |
| 2003/0038382 A1 | 2/2003 | Combs | |
| 2003/0057573 A1 | 3/2003 | Sekine et al. | |
| 2004/0173894 A1 | 9/2004 | Glenn et al. | |
| 2005/0067719 A1 | 3/2005 | Hayashi et al. | |
| 2005/0082690 A1 | 4/2005 | Hayashi et al. | |
| 2005/0082692 A1 | 4/2005 | Park et al. | |
| 2006/0096299 A1 | 5/2006 | Mamitsu et al. | |
| 2006/0250765 A1 | 11/2006 | Yamabuchi et al. | |
| 2009/0032916 A1 | 2/2009 | Shin et al. | |
| 2009/0091892 A1 | 4/2009 | Otsuka et al. | |
| 2009/0147479 A1 | 6/2009 | Mori et al. | |
| 2009/0194862 A1 * | 8/2009 | Kitami | H01L 23/4334 257/706 |
| 2010/0180441 A1 | 7/2010 | Otsuka et al. | |
| 2010/0187680 A1 | 7/2010 | Otsuka et al. | |
| 2011/0108963 A1 | 5/2011 | Balakrishnan et al. | |
| 2011/0310585 A1 | 12/2011 | Suwa et al. | |
| 2013/0278090 A1 | 10/2013 | Matsuo | |
| 2014/0141718 A1 | 5/2014 | Stromberg et al. | |
| 2014/0265743 A1 | 9/2014 | Chamberlin et al. | |
| 2015/0097281 A1 | 4/2015 | Adachi | |
| 2016/0197028 A1 | 7/2016 | Yamada et al. | |
| 2017/0117208 A1 | 4/2017 | Kasztelan et al. | |
| 2021/0021065 A1 | 1/2021 | Chang et al. | |

FOREIGN PATENT DOCUMENTS

| | | | | |
|---|---|---|---|---|
| DE | 10 2011 121 064 | | 6/2013 | |
| DE | 102012206271 | | 10/2013 | |
| DE | 102016110043 A1 * | | 12/2016 | ......... H01L 23/3677 |
| JP | H08-505985 A | | 6/1996 | |
| JP | H10-248198 A | | 9/1998 | |
| JP | H11-274771 | | 10/1999 | |
| JP | H11-346480 A | | 12/1999 | |
| JP | 2004-247684 | | 9/2004 | |
| JP | 2005-143151 A | | 6/2005 | |
| JP | 2005-354000 A | | 12/2005 | |
| JP | 2006-165534 | | 6/2006 | |
| JP | 2006-304522 A | | 11/2006 | |
| JP | 2009-081273 | | 4/2009 | |
| JP | 2009-182261 A | | 8/2009 | |
| JP | 2012-10540 A | | 1/2012 | |
| JP | 2012-147564 A | | 8/2012 | |
| JP | 2014-512678 A | | 5/2014 | |

OTHER PUBLICATIONS

Office Action issued in the counterpart German Patent Application No. 11 2016 005 528.5, Dec. 23, 2020, 15 pages including English translation.
Office Action issued for German Patent Application No. 11 2016 005 528.5, Jul. 3, 2023, 15 pages including English translation.

\* cited by examiner

FIG. 16A
FIG. 16B
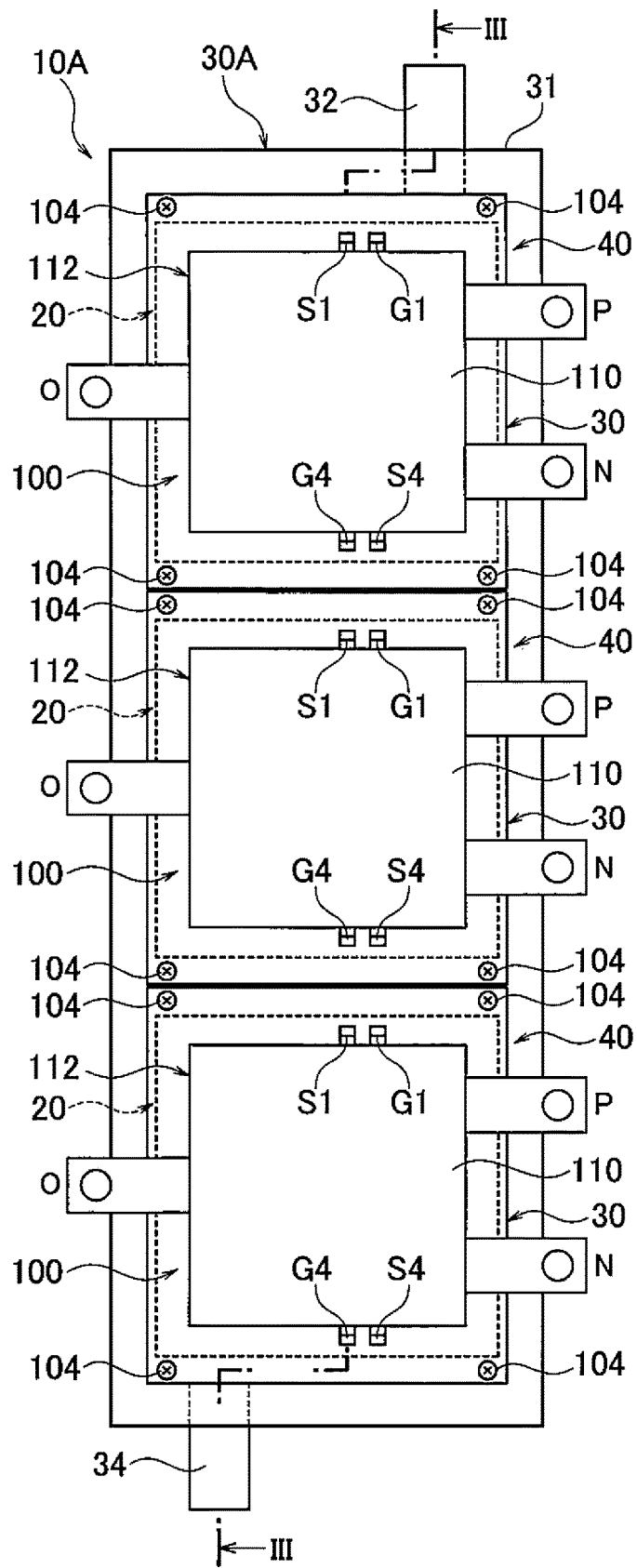
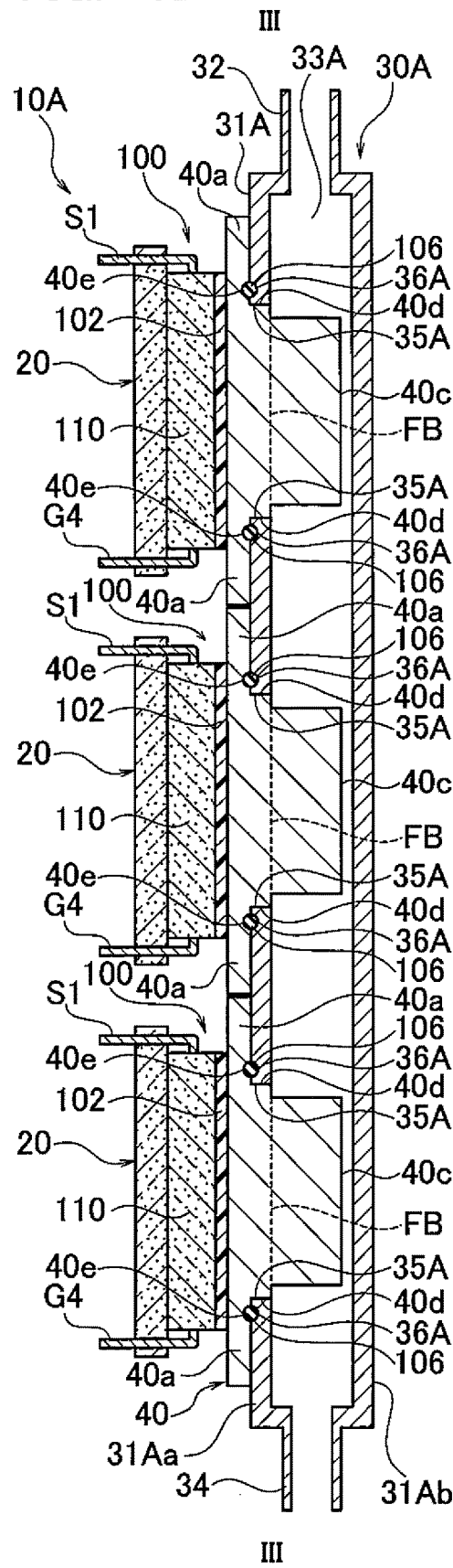

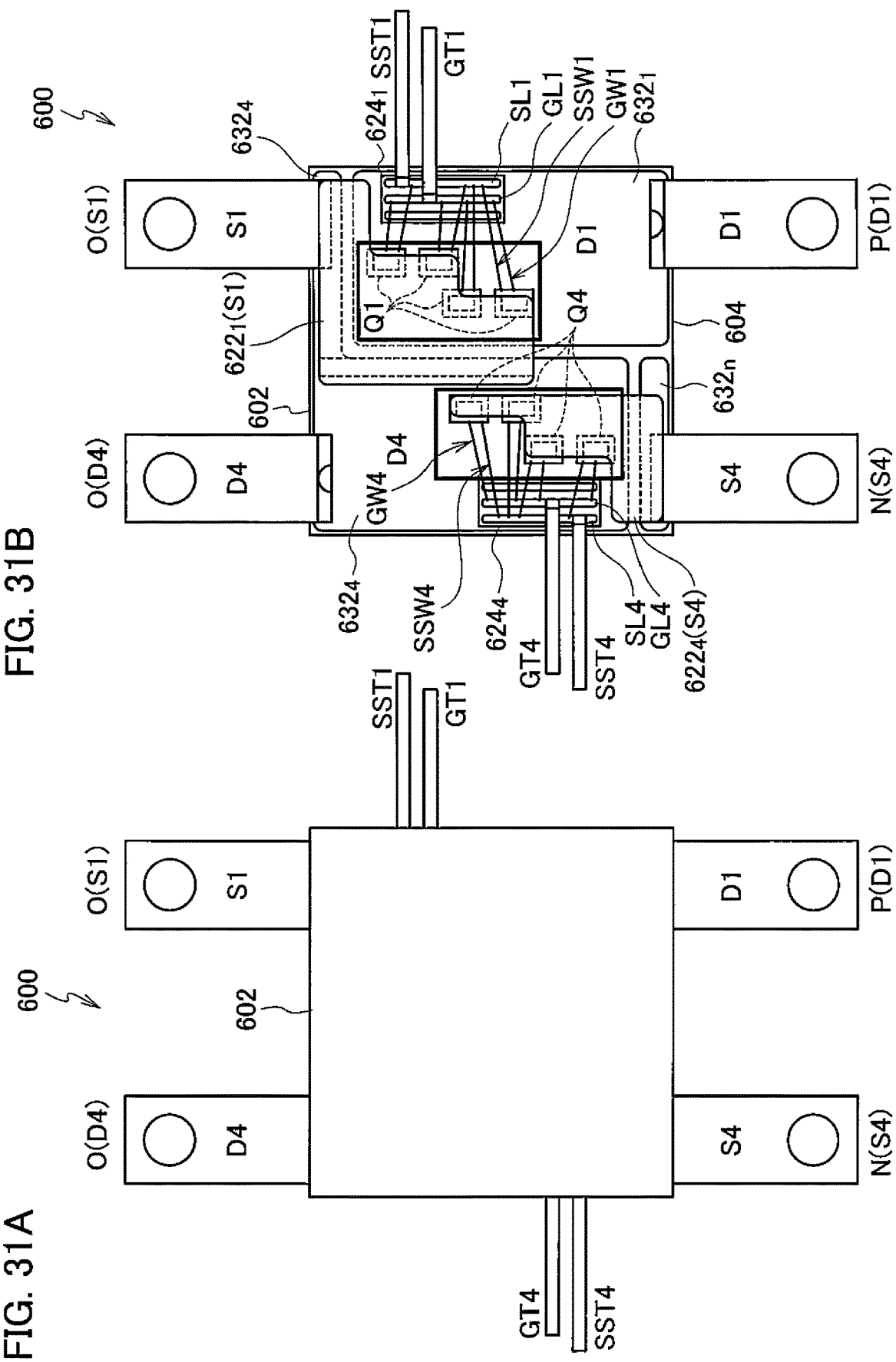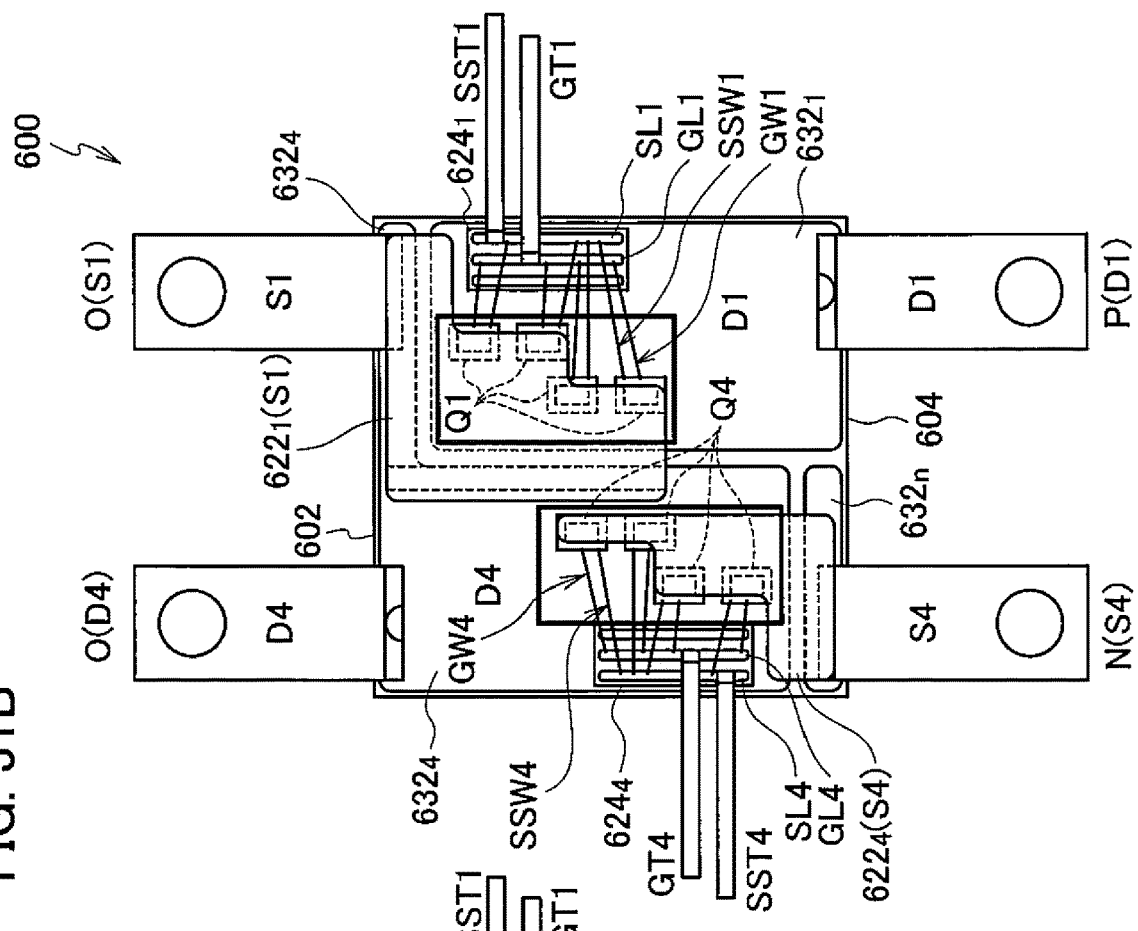

POWER MODULE APPARATUS, COOLING STRUCTURE, AND ELECTRIC VEHICLE OR HYBRID ELECTRIC VEHICLE

CROSS REFERENCE TO RELATED APPLICATIONS

This is a continuation application (CA) of Ser. No. 17/114,020, filed on Dec. 7, 2020, which is a continuation application (CA) of Ser. No. 16/511,696, filed on Jul. 15, 2019, which is a continuation application (CA) of Ser. No. 15/997,195, filed on Jun. 4, 2018, which is a continuation application (CA) of PCT Application No. PCT/JP2016/080658, filed on Oct. 17, 2016, which claims priority to Japan Patent Application No. P2015-237458 filed on Dec. 4, 2015 and is based upon and claims the benefit of priority from prior Japanese Patent Applications No. P2015-237458 filed on Dec. 4, 2015 and PCT Application No. PCT/JP2016/080658, filed on Oct. 17, 2016, the entire contents of each of which are incorporated herein by reference.

FIELD

The embodiments described herein relate a power module apparatus, a cooling structure, and an electric vehicle or hybrid electric vehicle.

BACKGROUND

Conventionally, as one of the power modules, there have been known power modules in which a power device(s) (power chip(s)) including semiconductor device (s) as an Insulated Gate Bipolar Transistor (IGBT) is mounted on a leadframe, and the whole system is molded with a resin. Since such a semiconductor device produces heat during an operating state, it is common to dispose a heat sink for dissipating heat on a back side surface of the leadframe in order to cool the semiconductor device.

Moreover, in order to improve cooling performance, there have been known: inverter apparatuses for water-cooling of whole of a heat sink (or also referred to as "liquid cooling") with a coolant passage formed on a back side surface of the heat sink; and semiconductor devices configured so that a rectangular parallelepiped having four side surfaces on which switching devices having large frequencies are respectively arranged in a hollow form in order to suppress a temperature increase of the devices.

SUMMARY

The embodiments provide: a power module apparatus and a cooling structure which are capable of being efficiently cooled by attaching a heat radiator to an opening formed at an upper surface portion of a cooling device, thereby reducing degradation due to overheating; and an electric vehicle or hybrid electric vehicle in which such a power module apparatus is mounted.

According to one aspect of the embodiments, there is provided a power module apparatus comprising: a power module comprising a semiconductor device configured to switch electric power, a sealing body configured to seal a perimeter of the semiconductor device, and a heat radiator bonded to one surface of the sealing body; and a cooling device comprising a coolant passage through which coolant water flows, in which the heat radiator of the power module is attached to an opening provided on a way of the coolant passage, wherein the heat radiator of the power module is attached to the opening of the cooling device so that a height from an inner surface of one side of the coolant passage where the opening is formed to an inner surface of another side of the coolant passage opposite to the one side where the opening is formed and a height from the other side of the coolant passage opposite to the one side of the coolant passage where the opening is formed to a surface of the heat radiator opposite to a contact surface of the coolant passage with the sealing body are substantially identical to each other.

According to another aspect of the embodiments, there is provided a power module apparatus comprising: a power module comprising a semiconductor device configured to switch electric power, a sealing body configured to seal a perimeter of the semiconductor device, and a heat radiator bonded to a one surface of the sealing body; and a cooling device for power modules comprising an inlet port and an outlet port, a coolant passage through which coolant water flows from the inlet port to the outlet port, and an opening for attaching the heat radiator, the opening provided on a way of the coolant passage, wherein a plurality of the cooling devices are three-dimensionally assembled so that the inlet port and the outlet port of the coolant passage are connected to one another.

According to still another aspect of the embodiments, there is provided a cooling structure comprising: a plurality of cooling devices each including a coolant passage, the plurality of cooling devices to which power modules are respectively attached, wherein the plurality of cooling devices are three-dimensionally assembled so as to connect the coolant passages to one another.

According to yet another aspect of the embodiments, there is provided an electric vehicle or hybrid electric vehicle comprising: the above-mentioned power module apparatus; and an engine control unit configured to control an operation of the power module apparatus.

According to the embodiments, there can be provided: the power module apparatus and the cooling structure which are capable of being efficiently cooled by attaching the heat radiator to the opening formed at the upper surface portion of the cooling device, thereby reducing degradation due to overheating; and the electric vehicle or hybrid electric vehicle in which such a power module apparatus is mounted.

BRIEF DESCRIPTION OF DRAWINGS

FIG. 16A is a top view diagram of a power module apparatus of which a portion is showed by being transmitted, which is a power module apparatus according to a second embodiment.

FIG. 16B is a schematic cross-sectional structure diagram of the power module apparatus taken in the line III-III of FIG. 16A, which is the power module apparatus according to the second embodiment.

FIG. 31A is a top view diagram of a power module applicable to the power module apparatus according to the embodiments.

FIG. 31B is a planar pattern configuration diagram showing an internal structure of the power module applicable to the power module apparatus according to the embodiments.

DESCRIPTION OF EMBODIMENTS

Figure 1A:
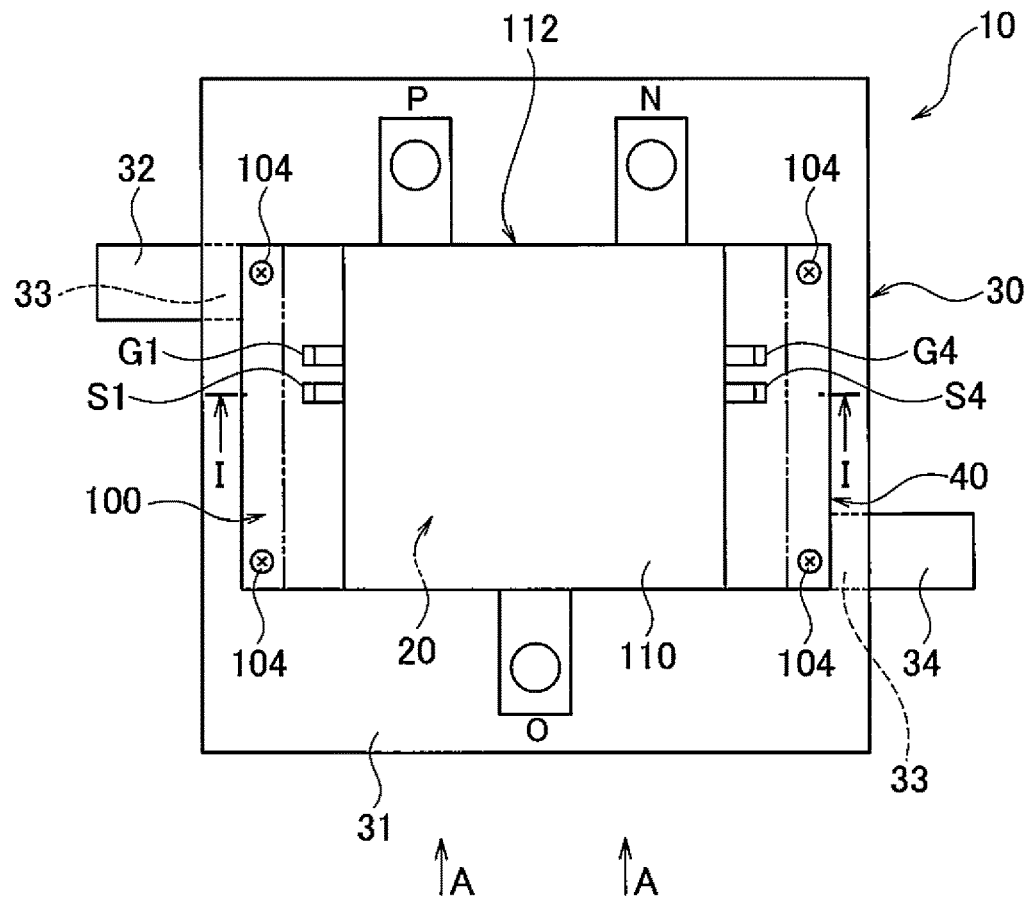
FIG. 1A is a top view diagram of a power module apparatus of which a portion is showed by being transmitted, which is a schematic structure of a power module apparatus according to a first embodiment.

Next, certain embodiments will now be explained with reference to drawings. In the description of the following drawings to be explained, the identical or similar reference numeral is attached to the identical or similar part. However, it should be noted that the drawings, such as a top view diagram, a side view diagram, a bottom view diagram, a cross-sectional diagram, are merely schematic and the relation between thickness and the plane size and the ratio of the thickness of each component part differs from an actual thing. Therefore, detailed thickness and size should be determined in consideration of the following explanation. Of course, the part from which the relation and ratio of a mutual size differ also in mutually drawings is included.

Moreover, the embodiments described hereinafter merely exemplify the device and method for materializing the technical idea; and the embodiments do not specify the material, shape, structure, placement, etc. of each component part as the following. The embodiments may be changed without departing from the spirit or scope of claims.

First Embodiment (Power Module Apparatus)

Figure 1B:
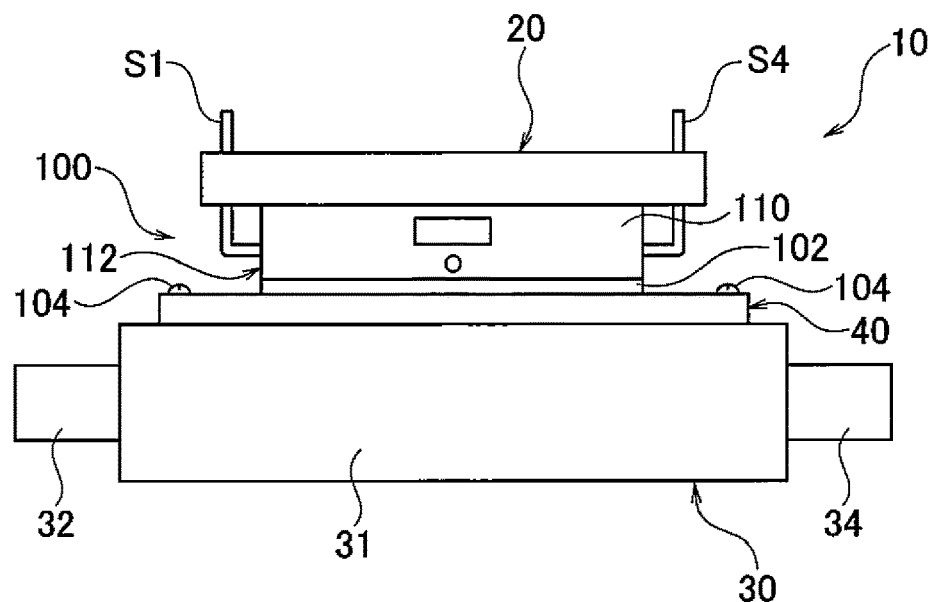
FIG. 1B is a side view diagram of the power module apparatus of which a portion is showed by being transmitted, which is a schematic structure of the power module apparatus according to the first embodiment.

FIG. 1A shows a planar structure of a power module apparatus 10 according to a first embodiment, and FIG. 1B shows a side surface (front face) structure of the power module apparatus 10. Herein, FIG. 1B illustrates a case of being observed from a side of the arrow A shown in FIG. 1A (i.e., a side of an output terminal electrode O).

As shown in FIGS. 1A and 1B, the power module apparatus 10 is composed by including: a power module 100 including a water-cooling (or referred to as liquid-cooling) type cooling apparatus 30; and a cooling device 30.

More specifically, the power module apparatus 10 according to the first embodiment includes: a power module 100 including a semiconductor package device 112 including a package (sealing body) 110 configured to seal a perimeter of a semiconductor device mentioned below, a heat radiator 40 bonded to a lower surface of the package 110, and a gate drive substrate 20 mounted on an upper surface of the package 110; and a cooling device (cooling body) 30 including a coolant passage 33, the cooling device 30 to which the power module 100 is attached via the heat radiator 40.

In the power module apparatus 10, the power module 100 is attached thereto so that the heat radiator 40 is attached to an opening formed at an upper surface portion of the cooling device 30, and is fixed with a fixing member 104, e.g. a screw or a bolt.

Figure 2:
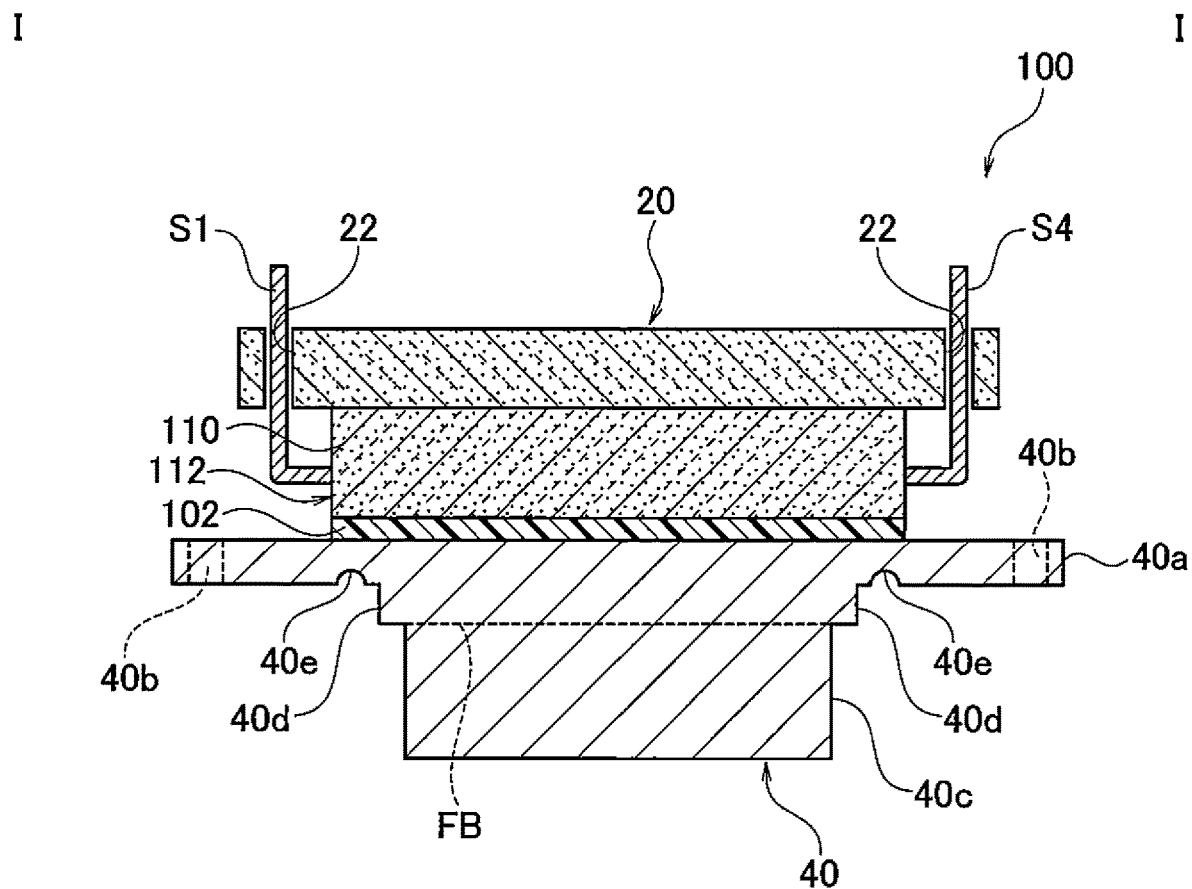
FIG. 2 is a schematic cross-sectional structure diagram of the power module taken in the line I-I of FIG. 1A, which is the power module apparatus according to the first embodiment.

As shown in FIG. 2, the power module 100 applied to the power module apparatus 10 according to the first embodiment includes a heat radiator 40 bonded to the lower surface of the package 110 via the bonding material 102. Moreover, the gate drive substrate 20 is mounted on the upper surface of the package 110 of the semiconductor package device 112 in which a perimeter of a semiconductor device (chip) to be implemented is rectangularly molded by the package 110. Note that FIG. 2 merely shows schematically the cross-sectional structure of the power module 100 taken in the line I-I of FIG. 1A, and a detailed structure in the package 110 is omitted. Also other cross-sectional diagrams shown hereinafter are similar thereto.

The gate drive substrate 20 is a substrate configured to package a control circuit for gate drives for controlling a drive of a power element etc. to be applied as a chip with a mold resin, for example, and includes an insertion hole 22 into which a lead terminal is inserted so as to be bent upwards. The gate drive substrate 20 is connected to the lead terminal by inserting the lead terminal into the insertion hole 22.

The gate drive substrate 20 may be disposed on the upper surface of the package 110 of the semiconductor package device 112 via a heat radiating resin sheet etc., for example.

The heat radiator 40 includes: an attaching portion 40*a* functioned also as a heat sink; and a plurality of cooling fins (heat radiation fins or flat plate fins) 40*c* disposed by including a stepped portion 40*d* at a lower surface (back side surface) side of the attaching portion 40*a*. The heat radiator 40 is attached to the opening 35 opened in the mounting portion 31*a* on the upper surface of the cooling device 30 mentioned below so that the stepped portion 40*d* is contained therein, and thereby the cooling fin 40*c* is exposed in the coolant passage 33.

Figure 3A:
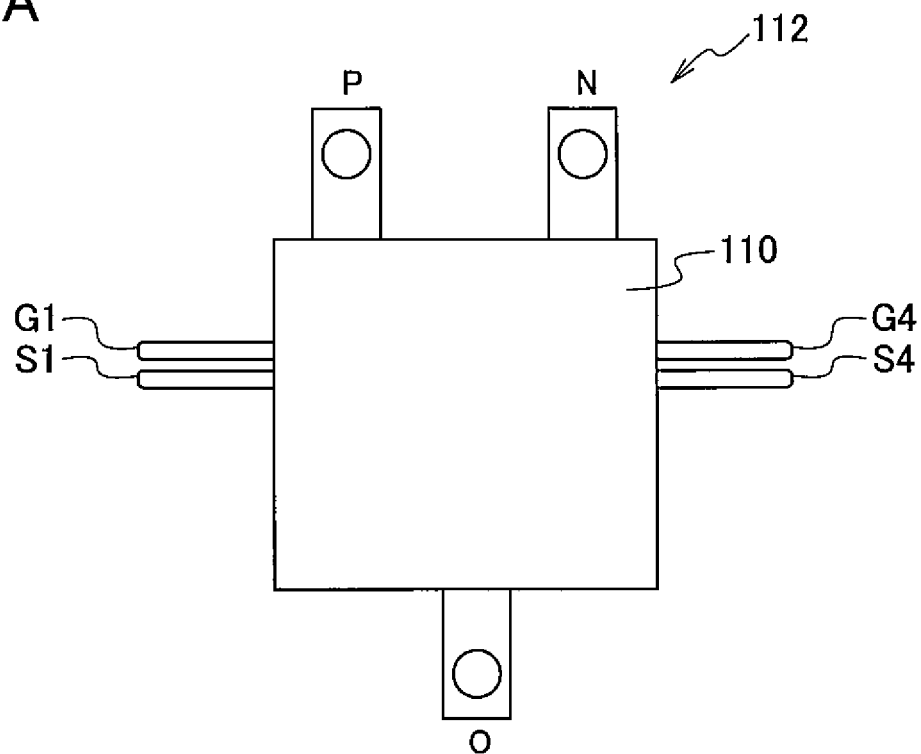
FIG. 3A is a top view diagram of a power module applicable to the power module apparatus according to the first embodiment.
Figure 3B:
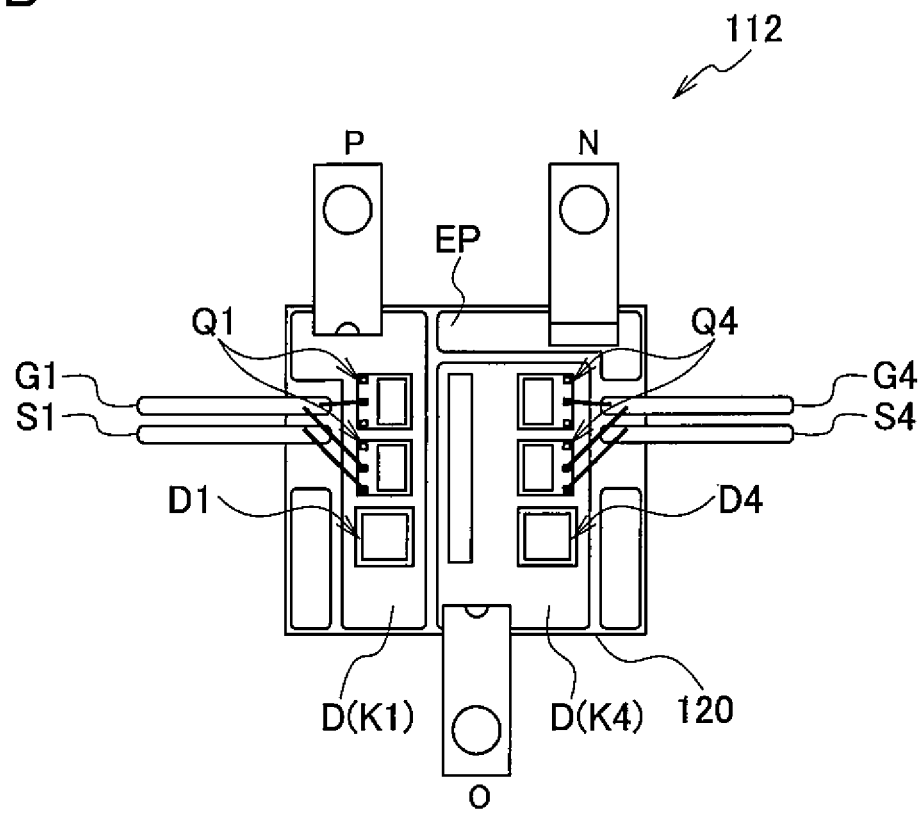
FIG. 3B is a planar pattern configuration diagram showing an internal structure of the power module applicable to the power module apparatus according to the first embodiment.

As shown in FIGS. 3A and 3B, for example, the semiconductor package device 112 includes: diodes DI1 and DI4;

semiconductor devices Q1 and Q4; plate-shaped electrodes (not illustrated); the package 110 composed by including a mold resin; etc. In the power module 100 to be applied to the power module apparatus 10 according to the first embodiment, FIG. 3A shows an outer appearance structure (plane configuration) of the semiconductor package device 112, and FIG. 3B shows an internal structure (planar pattern configuration) of the semiconductor package device 112.

In the semiconductor package device 112, a drain terminal electrode P and a ground (earth) potential terminal electrode N provided along a first side of the package 110, an output terminal electrode O provided at a third side opposite to the first side, and lead terminals (G1, S1 and G4, S4) provided along second and fourth sides respectively orthogonal to the first and third sides are respectively extended to an outside of the package 110.

In the semiconductor package device 112, two-chip semiconductor devices Q1 and Q4 are respectively disposed on first and second patterns D(K1) and D(K4) disposed on a surface of the ceramics substrate 120; and the semiconductor devices Q1 and Q4 are connected to each other in parallel. More specifically, gate electrodes of the two-chip semiconductor devices Q1 are wire-bonding connected to the gate signal terminal electrode (lead terminal) G1; source sense electrodes of the 2-chip semiconductor devices Q1 are wire-bonding connected to the source signal terminal electrode (lead terminal) S1; drain electrodes of the 2-chip semiconductor devices Q1 are connected to the first pattern D(K1) via aback surface electrode of each chip; and source electrodes of the 2-chip semiconductor devices Q1 are connected to the output terminal electrode O via wirings (not illustrated) provided on upper surfaces of the respective chips. Similarly, gate electrodes of the two-chip semiconductor devices Q4 are wire-bonding connected to the gate signal terminal electrode (lead terminal) G4; source sense electrodes of the 2-chip semiconductor devices Q4 are wire-bonding connected to the source signal terminal electrode (lead terminal) S4; drain electrodes of the 2-chip semiconductor devices Q4 are connected to the second pattern D(K4) via aback surface electrode of each chip; and source electrodes of the 2-chip semiconductor devices Q4 are connected to a third pattern EP disposed on the surface of the ceramics substrate 120 via wirings (not illustrated) provided on upper surfaces of the respective chips.

The first pattern D(K1) is connected to the drain terminal electrode P, the second pattern D(K4) is connected to the output terminal electrode O, and the third pattern EP is connected to the ground (earth) potential terminal electrode N. A pillar electrode for wiring and for Coefficient of Thermal Expansion (CTE) adjustment may be disposed on the third pattern EP.

Although illustration is omitted, a first upper surface plate electrode is disposed via a pillar electrode on the two-chip semiconductor device Q1 and the diode DI1. Similarly, a second upper surface plate electrode is disposed via a pillar electrode on the two-chip semiconductor device Q4 and the diode DI4.

Moreover, a copper plate layer (not illustrated) functioned as a heat spreader is exposed, by being connected to the ceramics substrate 120, to the package 110 of the back surface side of the semiconductor package device 112 to which the heat radiator 40 is bonded shown in FIG. 2.

FIG. 3B illustrates a 2-in-1 type module, as an example.

Figure 4:
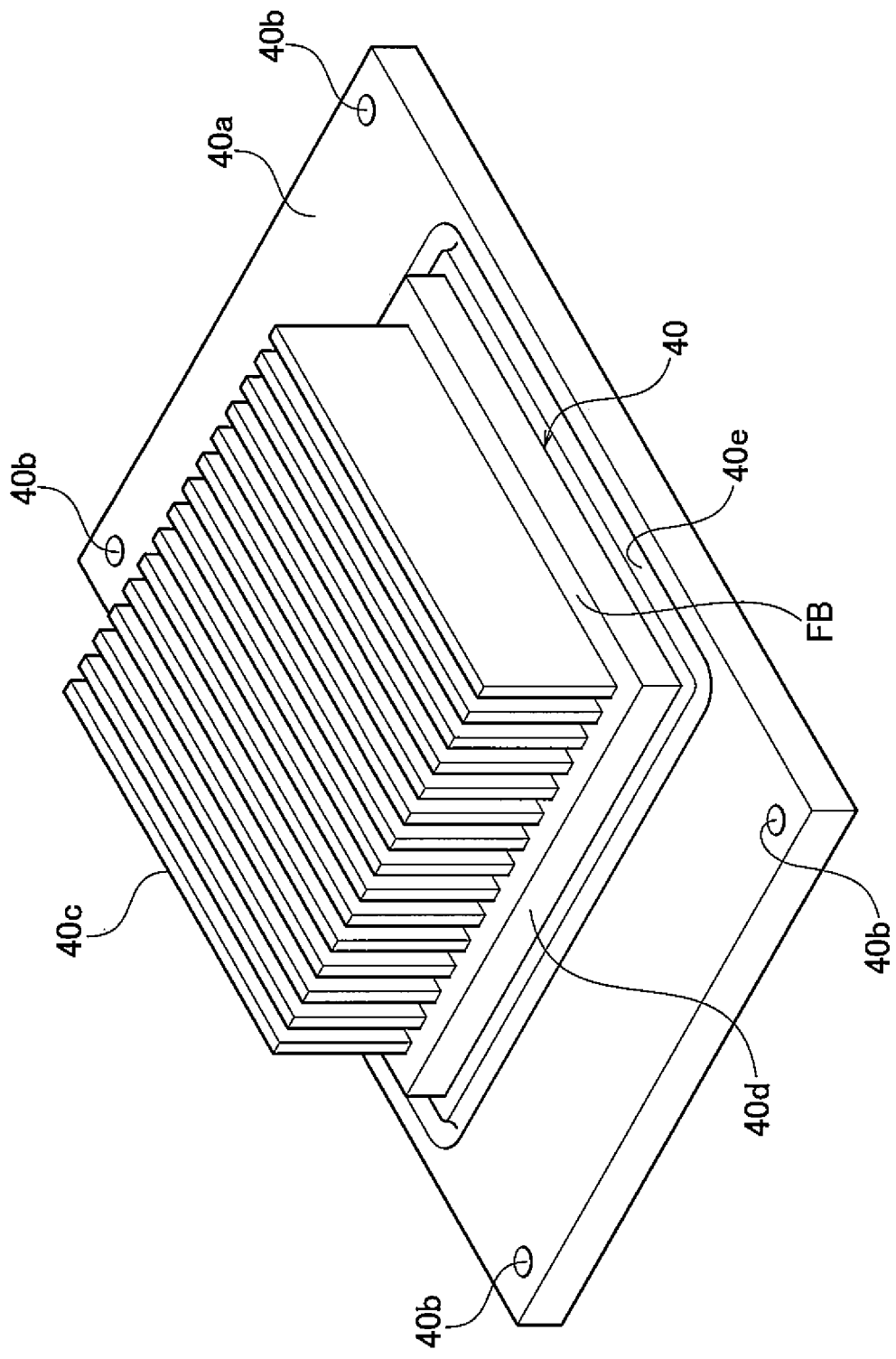
FIG. 4 is a back surface side bird's-eye view configuration diagram of the power module applicable to the power module apparatus according to the first embodiment.

In the power module 100 to be applied to the power module apparatus 10 according to the first embodiment, FIG. 4 shows a bird's-eye view configuration at a side of the lower surface of the heat radiator 40, for example.

The copper plate layer (not illustrated) exposed from the package 110 of the back surface side of the semiconductor package device 112 is bonded via the bonding material 102 on an upper surface of the attaching portion 40a of the heat radiator 40. Moreover, the stepped portion 40d, a plurality of the cooling fins 40c disposed using the stepped portion 40d as a base edge FB, and a groove portion 40e for O ring formed so as to enclose a periphery of the stepped portion 40d are formed on a side of a surface (non-contact surface) opposite to the bonded surface. Moreover, a through hole 40b into which a fixing member 104, e.g. a screw or a bolt, is inserted is provided at each of four corners of the attaching portion 40a.

In addition, the heat radiator 40 is disposed so that a direction of each cooling fin 40c is identical to a flowing water direction of a coolant water which flows through an inside of the coolant passage 33 of the cooling device 30, and thereby the cooling fin 40c does not interfere with flow of the coolant water. Although details are mentioned below, the heat radiator 40 is attached thereto so that a base edge (non-bonded surface) FB of the cooling fin 40c shown with the dashed line in FIG. 2 is provided at the substantially same plane as that of an uppermost portion of the coolant passage 33 in the cooling device 30 (internal wall surface of the mounting portion 31a), and thereby the attaching portion does not interfere with flow of the coolant water which flows through the inside of the coolant passage 33.

The bonding material 102 having a coefficient of thermal conductivity within a range of 0.5 W/mK to 300 W/mK is preferable, for example, and an organic material of any one of an epoxy resin, an acrylic resin, a silicone resin, a urethane resin, or polyimide can be used as a simple substance for the bonding material 102. Moreover, the bonding material 102 may be a synthetic resin with which a metal powder or various ceramic powders are mixed in any one of the above-mentioned organic materials. Alternatively, various solder, firing silver, etc. used by being cured by heating may also be used as the bonding material 102.

The heat radiator 40 may be integrally formed of a metal (s) having high thermal conductivity, for example, or can also be formed by bonding the attaching portion 40a and the cooling fin 40c after separately forming the attaching portion 40a and the cooling fin 40c.

First Modified Example

Figure 5:
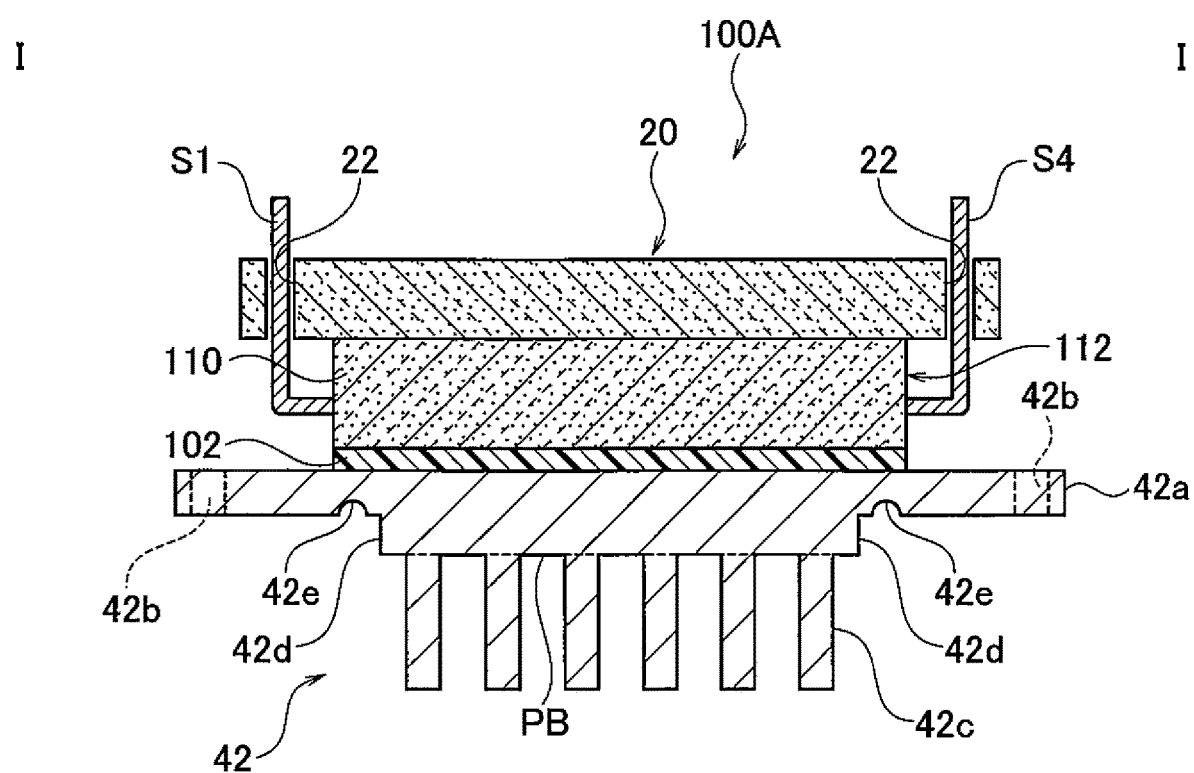
FIG. 5 is a schematic cross-sectional structure diagram of a power module applicable to a power module apparatus according to a first modified example of the first embodiment, taken in the line I-I of FIG. 1A.

As a power module 100A applicable to a power module apparatus 10 according to a first modified example of the first embodiment, as shown in FIG. 5, the heat radiator 42 may have a configuration including: an attaching portion 42a functioned also as a heat sink; a through hole 42b into which a fixing member 104 is inserted; a plurality of cooling pins (heat radiation pin) 42c disposed so as to include a stepped portion 42d at a lower surface (back side surface) side of the attaching portion 42a; and a groove portion 42e for O ring.

Figure 6:
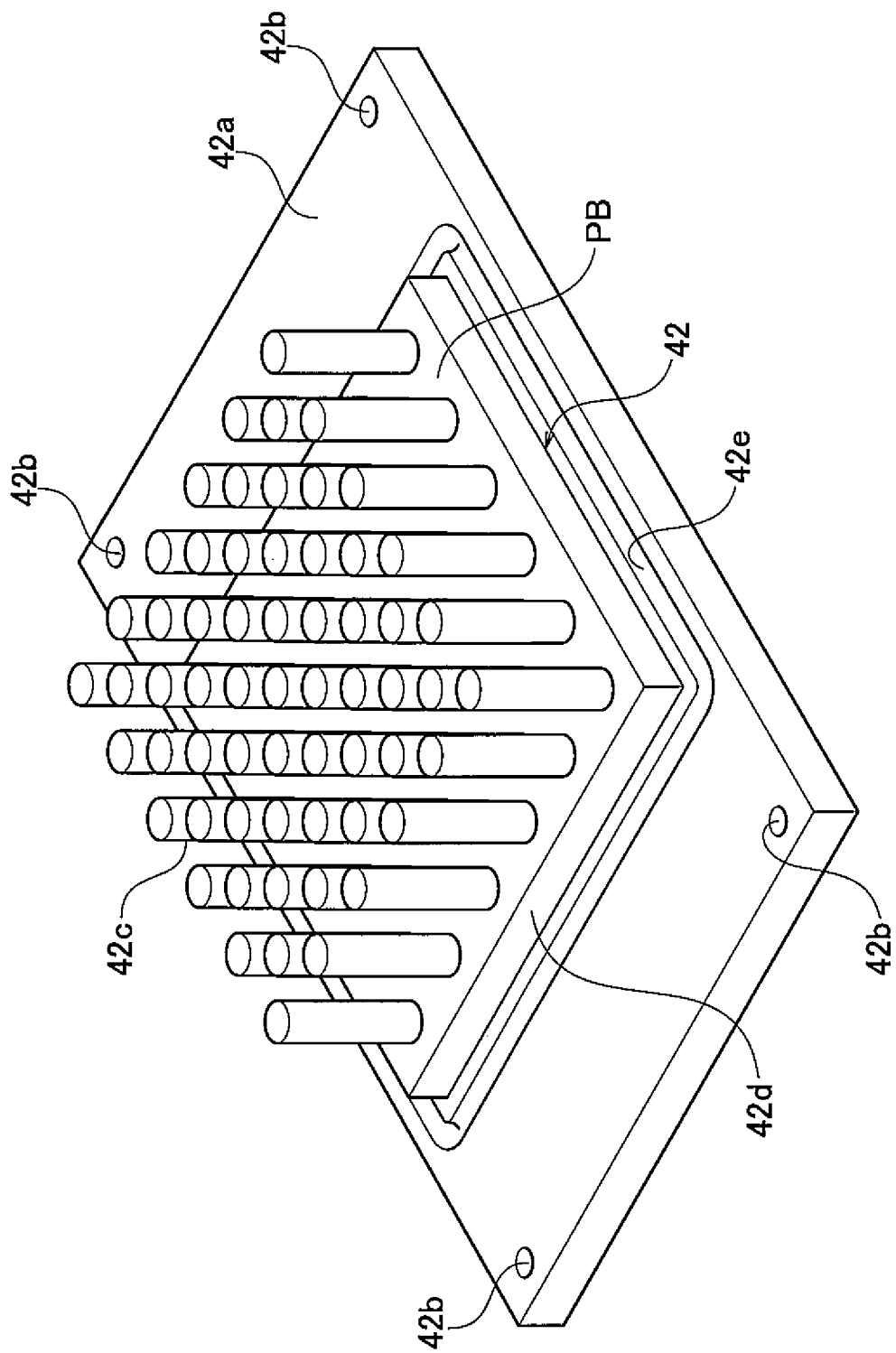
FIG. 6 is aback surface side bird's-eye view configuration diagram of the power module applicable to the power module apparatus according to the first modified example of the first embodiment.

More specifically, FIG. 6 shows a bird's-eye view configuration at a side of a lower surface of the heat radiator 42, for example, in the power module 100A to be applied to the power module apparatus 10 according to the first modified example of the first embodiment.

The copper plate layer (not illustrated) exposed from the package 110 of the back surface side of the semiconductor package device 112 is bonded via the bonding material 102 on an upper surface of the attaching portion 42a of the heat radiator 42. Moreover, the stepped portion 42d, a plurality of the cooling pins 42c disposed using the stepped portion 42d as a base edge PB, and a groove portion 42e for O ring formed so as to enclose a periphery of the stepped portion 42d are formed on a side of a surface (non-contact surface) opposite to the bonded surface. Moreover, a through hole 42b into which a fixing member 104, e.g. a screw or a bolt, is inserted is provided at each of four corners of the attaching portion 42a.

In the heat radiator 42, a plurality of cooling pins 42c are arranged so as to form a checkered pattern. Although details are mentioned below, the heat radiator 42 is attached thereto so that a base edge (non-bonded surface) PB of the cooling pin 42c is provided at the substantially same plane as that of an uppermost portion of the coolant passage 33 in the cooling device 30 (internal wall surface of the mounting portion 31a).

Figure 7A:
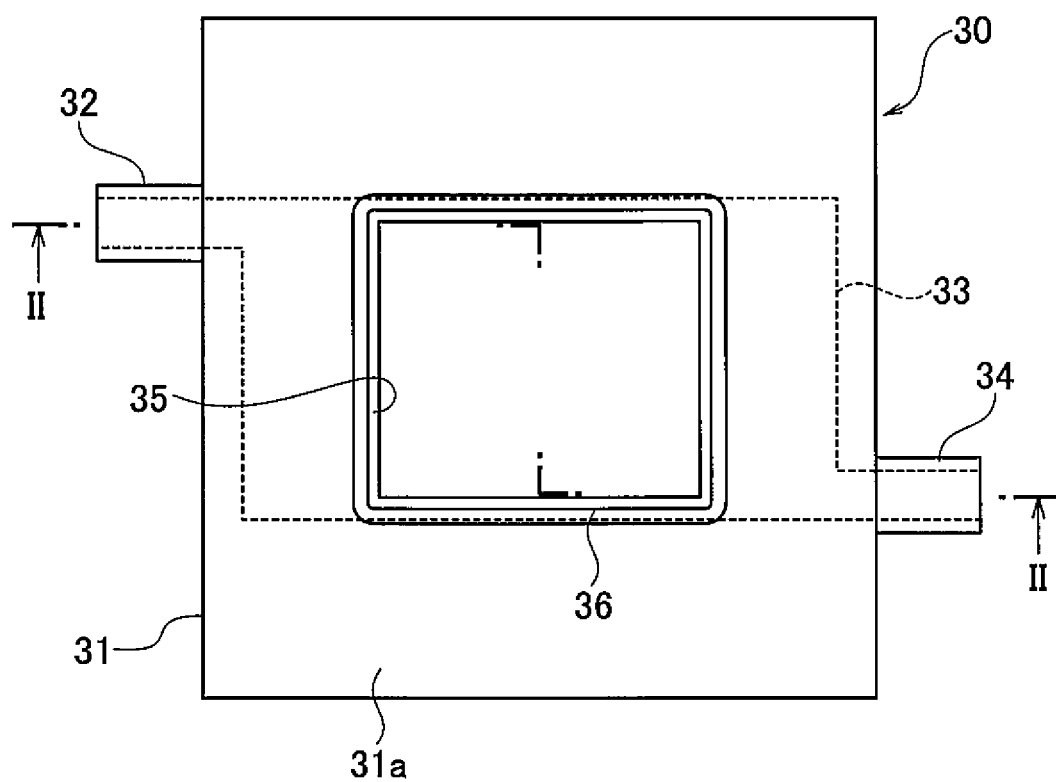
FIG. 7A is a top view diagram of a cooling device, showing a schematic structure of the cooling device in the power module apparatus according to the first embodiment.
Figure 7B:
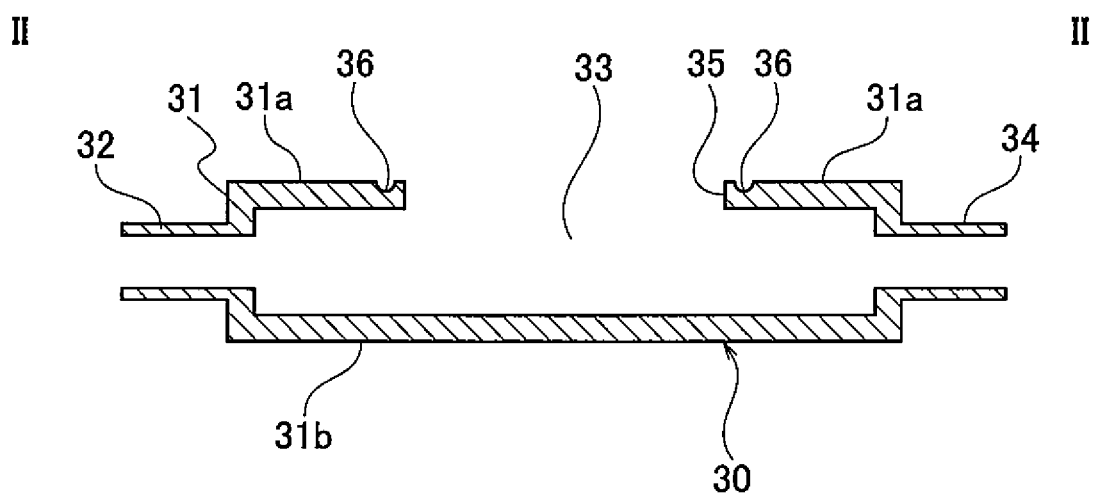
FIG. 7B is a schematic cross-sectional structure diagram of the cooling device taken in the line II-II of FIG. 7A.

FIG. 7A shows a planar structure of the cooling device 30 to be applied to the power module apparatus 10 according to the first embodiment including the first modified example, and FIG. 7B shows a cross-sectional structure of the cooling device 30 taken in the line II-II of FIG. 7A.

More specifically, the cooling device 30 circulates coolant water from an outside of the cooling device 30 into an inside of the coolant passage 33 in order to cool the power modules 100 and 100A via the cooling fins 40c or cooling pins 42c with the coolant water. The cooling device 30 has a cooling body unit 31 having a box-like rectangular parallelepiped shape, for example. The cooling device 30 includes: an inlet port (inlet) 32 provided at one side surface of the cooling body unit 31, the inlet port 32 configured to take in the coolant water to the coolant passage 33; and an outlet port (outlet) 34 provided at another side surface opposite to the one side surface thereof, the outlet port 34 configured to take the coolant water out of the coolant passage 33. The inlet port 32 is disposed on an extension of one sidewall of the coolant passage 33 along a flowing water direction of the coolant water, and the outlet port 34 is disposed on an extension of another sidewall of the coolant passage 33 along the flowing water direction of the coolant water.

Moreover, the mounting portion (upper surface portion) 31a composes the cooling body unit 31 of the cooling device 30, and the power modules 100 and 100A are attached to the mounting portion 31a. Opening 35 according to a size of the stepped portion 40d or 42d of the heat radiator 40 or 42 for attaching the cooling fin 40c or cooling pin 42c so as to be exposed in the coolant passage 33 is opened at a substantially center portion of the mounting portion (upper surface portion) 31a. Furthermore, a groove portion 36 for O ring 106 is formed on the mounting portion 31a so that a periphery of the opening 35 is enclosed.

In FIG. 7A and FIG. 7B, in order to prevent a leakage of the coolant water, the size of the inlet port (inlet) 32 and the outlet port (outlet) 34 is formed to be significantly smaller than the width of the coolant passage 33, but the size of the inlet port 32 and the outlet port 34 may be formed to be the same degree as the width of the coolant passage 33.

For the coolant water, water or a mixed solution to which water and ethylene glycol are mixed at each rate of 50% is used, for example.

Figure 8A:
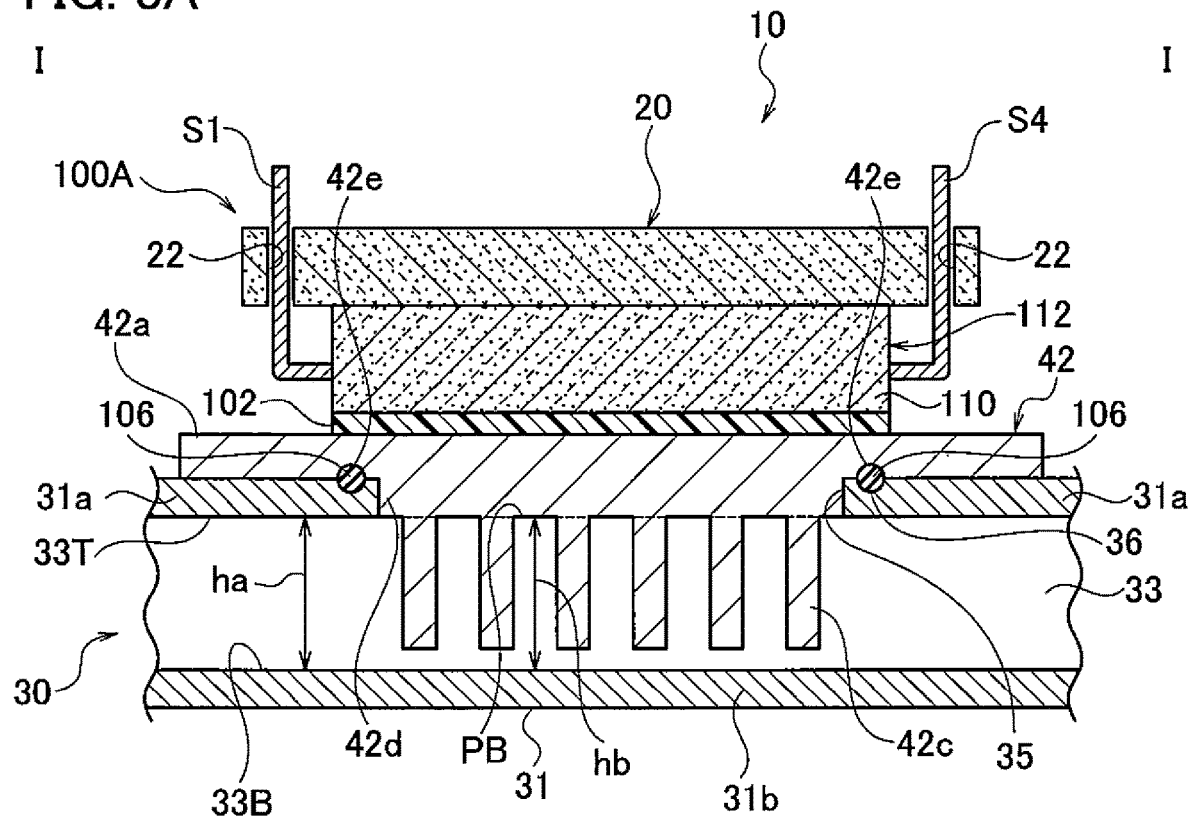
FIG. 8A is a schematic cross-sectional structure diagram of a principal portion of the power module apparatus according to the first modified example of the first embodiment, for comparing between the power module apparatus according to the first modified example and a power module apparatus according to a comparative example.

In the power module apparatus 10 according to the first modified example of the first embodiment, as shown in FIG. 8A, for example, the power module 100A is attached on the cooling device 30 in a state of the O ring 106 is provided between the groove portion 36 of the cooling body unit 31 and the groove portion 42e of the heat radiator 42, and the attaching portion 42a of the heat radiator 42 is also fixed thereto with the fixing member 104, and thereby the power module 100A and the cooling device 30 are closely-attached to each other in a watertight state.

In the case of the attachment, a thickness of the mounting portion 31a in the opening 35 of the cooling body unit 31 and a thickness of the stepped portion 42d of the heat radiator 42 are formed so as to be the same degree as each other, and thereby it is possible to attach the heat radiator 42 to the cooling device 30 so that the base edge PB of the cooling pin 42c is provided at the substantially same plane as that of an internal wall surface of the mounting portion 31a.

More specifically, in FIG. 8A, the height ha from the lowermost portion 33B to the uppermost portion 33T of the coolant passage 33 and the height hb from the lowermost portion 33B of the coolant passage 33 to the base edge PB of the cooling pin 42c are substantially identical to each other (ha≈hb). In other words, the heat radiator 42 is attached thereto so that a height from an inner surface of one side of the coolant passage where the opening is formed to an inner surface of another side of the coolant passage opposite to the one side where the opening is formed, and a height from the other side of the coolant passage opposite to the one side of the coolant passage where the opening is formed to a surface of the heat radiator opposite to a contact surface of the coolant passage with the sealing body are substantially identical to each other. Accordingly, the power module apparatus 10 according to the first modified example of the first embodiment can inhibit the attaching portion's interference with flow of the coolant water, thereby uniformly cooling the whole cooling pins 42c with the coolant water which flows through the inside of the coolant passage 33. Consequently, according to the power module apparatus 10 according to the first modified example of the first embodiment, the power module 100A in which the heat radiator 42 is attached to the opening 35 formed at the upper surface portion of the cooling device 30 can also be efficiently cooled, and thereby it becomes possible to reduce degradation due to overheating.

Comparative Example

Figure 8B:
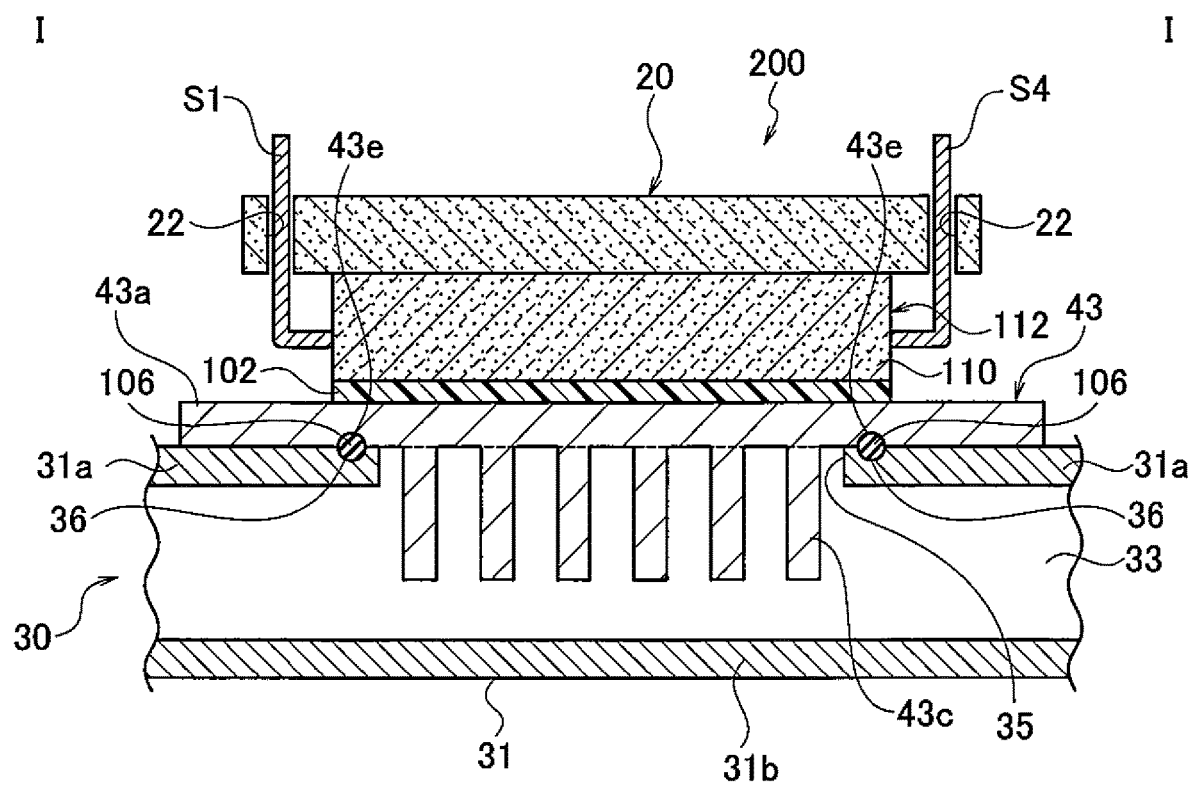
FIG. 8B is a schematic cross-sectional structure diagram of a principal portion of the power module apparatus according to the comparative example, for comparing between the power module apparatus according to the first modified example of the first embodiment and the power module apparatus according to the comparative example.

On the other hand, in a power module apparatus 200 according to a comparative example, as shown in FIG. 8B, since there is no stepped portion at a non-bonded surface of an attaching portion 43a, a step height between a base edge of cooling pins 43c of a heat radiator 43 and a thickness of a mounting portion 31a in an opening 35 interferes with flow of coolant water, and thereby it becomes impossible to efficiently cool in particular at the base edge of the cooling pins 43c since the coolant water which flows through the inside of the coolant passage 33 is easily stagnated.

Not only in the case of the power module apparatus 10 according to the first modified example but also the case of the power module apparatus 10 according to the first embodiment, it becomes possible similarly to attach the heat radiator 40 to the cooling device 30 so that the base edge FB of the cooling fin 40c is provided at the substantially same plane as that of the uppermost portion of the coolant passage 33. Accordingly, it can inhibit interference with the flow of the coolant, and thereby it can uniformly cool the whole cooling fins 40c with the coolant water which flows through the inside of the coolant passage 33. As a result, the power module 100 in which the heat radiator 40 is attached to the opening 35 formed at the upper surface portion of the cooling device 30 can also be efficiently cooled, and thereby it becomes possible to reduce degradation due to overheating.

Second Modified Example

Figure 9:
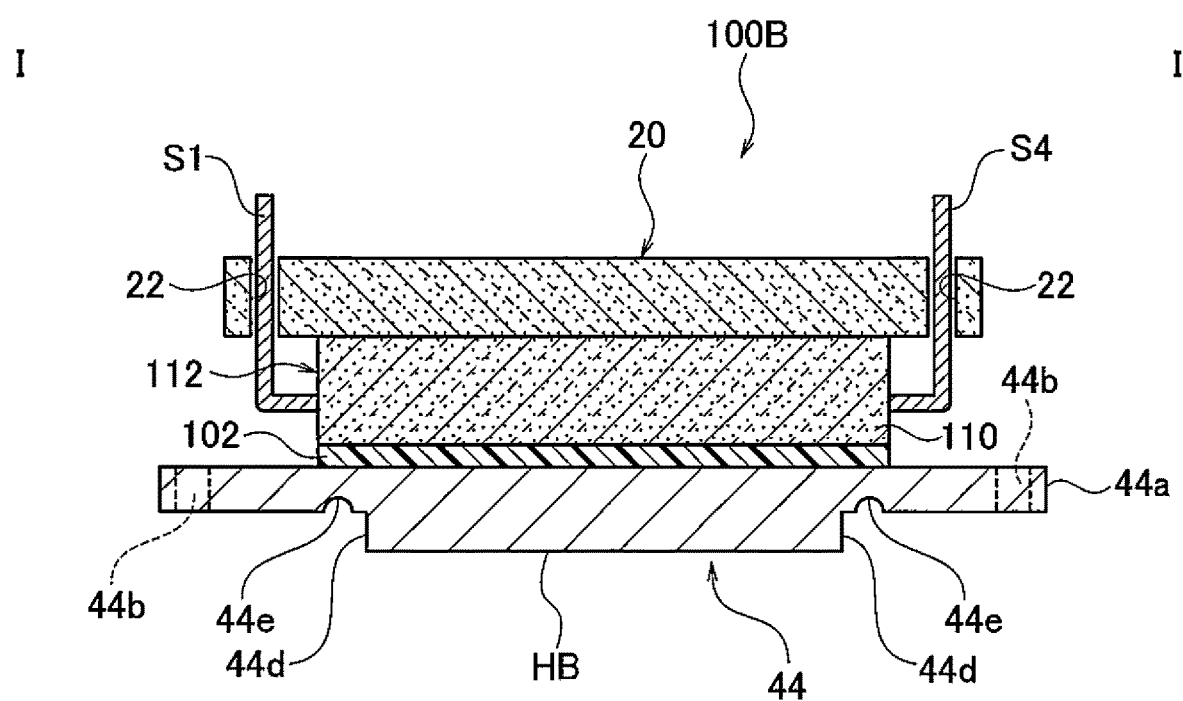
FIG. 9 is a schematic cross-sectional structure diagram of a power module applicable to a power module apparatus according to a second modified example of the first embodiment, taken in the line I-I of FIG. 1A.

As shown in FIG. 9, in a power module 100B to be applied to a power module apparatus 10 according to a second modified example of the first embodiment, a heat radiator 44 may have a configuration including: an attaching portion 44a functioned also as a heat sink; a through hole 44b into which a fixing member 104 is inserted; a stepped portion 44d provided at a lower surface (back side surface) side of an attaching portion 44a; and a groove portion 44e for O ring configured to enclose the stepped portion 44d. More specifically, also in the case of the configuration in which the heat radiator 44 does not have a plurality of cooling fins or cooling pins, the heat radiator 44 is similarly attached to the cooling device 30 so that the base edge (non-bonded surface) HB of the stepped portion 44d is provided at the substantially same plane as that of the uppermost portion of the coolant passage 33, and thereby interference with flow of the coolant water can be inhibited. Accordingly, the power module 100B in which the heat radiator 44 is attached to the opening 35 formed at the upper surface portion of the cooling device 30 can also be efficiently cooled, and thereby it becomes possible to reduce degradation due to overheating.

(Power Module)

Next, there will now be explained concrete examples (divided leadframe structure) of the power modules 100, 100A, and 100B applicable to the power module apparatus 10 according to the first embodiment.

There will now be explained a semiconductor package device 112 (the so-called 2-in-1 type of module) in which two semiconductor devices Q1 and Q4 are molded into one package 100, as a power module 100 applicable to the power module apparatus according to the first embodiment.

Figure 10A:
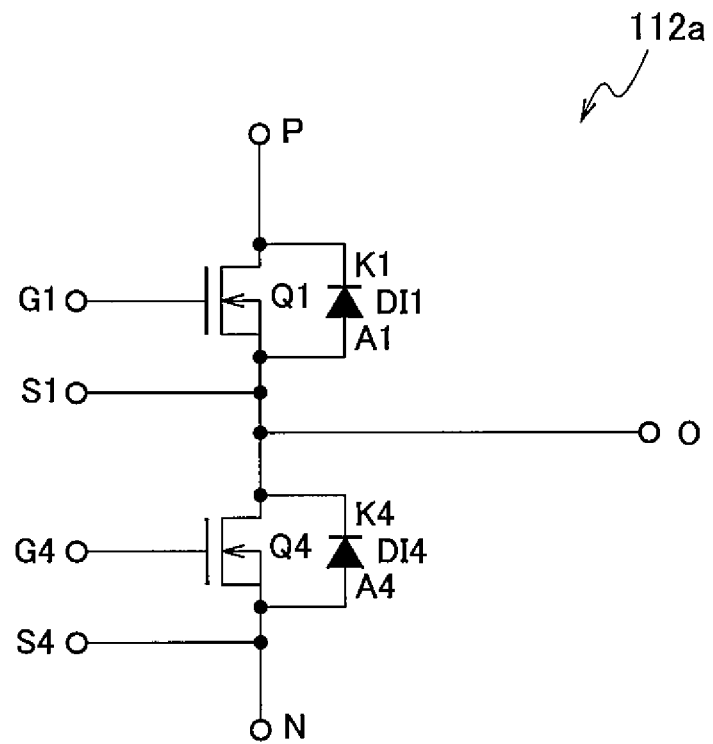
FIG. 10A is a circuit configuration diagram of a Silicon Carbide Metal Oxide Semiconductor Field Effect Transistor (SiC MOSFET), in an example of a 2-in-1 module applied to the power module apparatus according to the first embodiment.

FIG. 10A shows a circuit configuration of 2 in 1 module 112a to which a Silicon Carbide Metal Oxide Semiconductor Field Effect Transistor (SiC MOSFET) is applied as the semiconductor devices Q1 and Q4.

More specifically, as shown in FIG. 10A, the 2 in 1 module 112a includes a configuration of module with the built-in half-bridge in which two SiC MOSFETs Q1 and Q4 is included as one module.

Although each of the SiC MOSFETs Q1 and Q4 in the module is described as one transistor, a plurality of chips may be connected in parallel. Alternatively, a plurality of sets of transistor circuits can also be included in the module. More specifically, there are a 1-in-1 module, a 2-in-1 module, a 4-in-1 module, a 6-in-1, etc. as the module. For example, a module containing two pieces of transistors (chips) on one module is called the 2-in-1 module, a module containing two pieces of 2-in-1 modules on one module is called the 4-in-1 module, and a module containing three pieces of 2-in-1 modules on one module is called the 6-in-1 module.

As shown in FIG. 10A, the 2-in-1 module 112a includes two SiC MOSFETs Q1 and Q4, and diodes DI1 and DI4 connected in reversely parallel to the SiC MOSFETs Q1 and Q4, as one module. Reference numeral G1 denotes a gate signal terminal electrode of the SiC MOSFET Q1, and reference numeral S1 denotes a source terminal electrode of the SiC MOSFET Q1. Reference numeral G4 denotes a gate signal terminal electrode of the SiC MOSFET Q4, and reference numeral S4 denotes a source terminal electrode of the SiC MOSFET Q4 for a source sense. Reference numeral P denotes a positive side power input terminal (drain terminal electrode), reference numeral N is a negative side power input terminal (ground (earth) potential terminal electrode), and reference numeral O is an output terminal electrode.

Figure 10B:
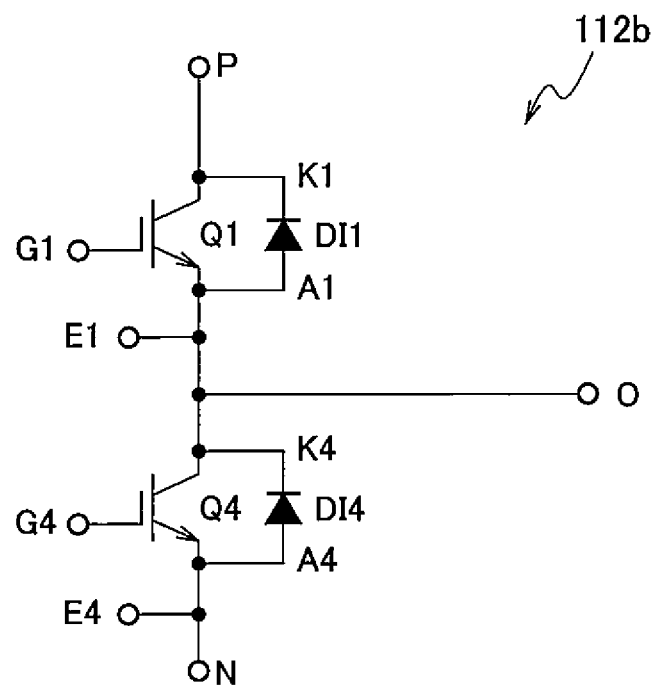
FIG. 10B is a circuit configuration diagram of an IGBT, in an example of a 2-in-1 module applied to the power module apparatus according to the first embodiment.

Moreover, FIG. 10B shows a circuit configuration of 2-in-1 module 112b to which Insulated Gate Bipolar Transistor (IGBT) is applied as semiconductor devices Q1 and Q4, as the power module 100 applicable to the power module apparatus 10 according to the first embodiment.

As shown in FIG. 10B, the 2-in-1 module 112b includes two IGBTs Q1 and Q4, and diodes DI1 and DI4 connected in reversely parallel to the IGBTs Q1 and Q4, as one module. Reference numeral G1 denotes a gate signal terminal electrode of the IGBT Q1, and reference numeral E1 denotes an emitter terminal electrode of the IGBT Q1. Reference numeral G4 denotes a gate signal terminal electrode of the IGBT Q4, and reference numeral E4 denotes an emitter terminal electrode of the IGBT Q4. Reference numeral P denotes a positive side power input terminal, reference numeral N denotes a negative side power input terminal, and reference numeral O denotes an output terminal electrode.

(Semiconductor Device)

Figure 11A:
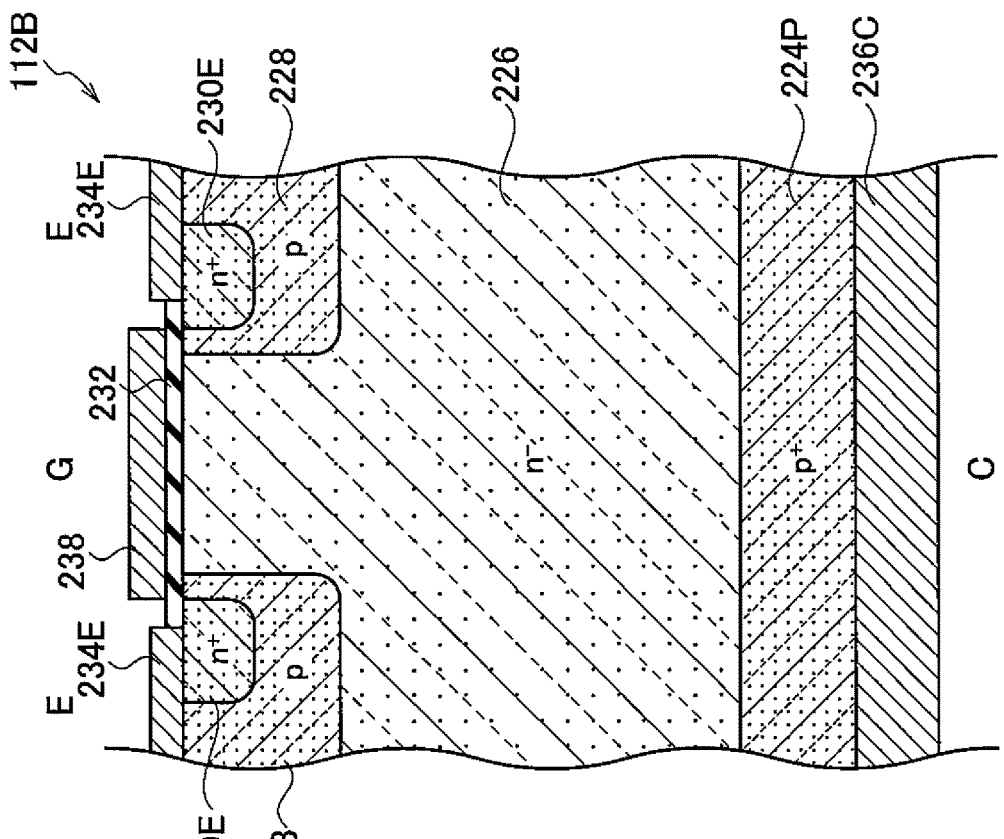
FIG. 11A is a circuit configuration diagram of a SiC MOSFET, in an example of a power chip applied to the power module apparatus according to the first embodiment.
Figure 11B:
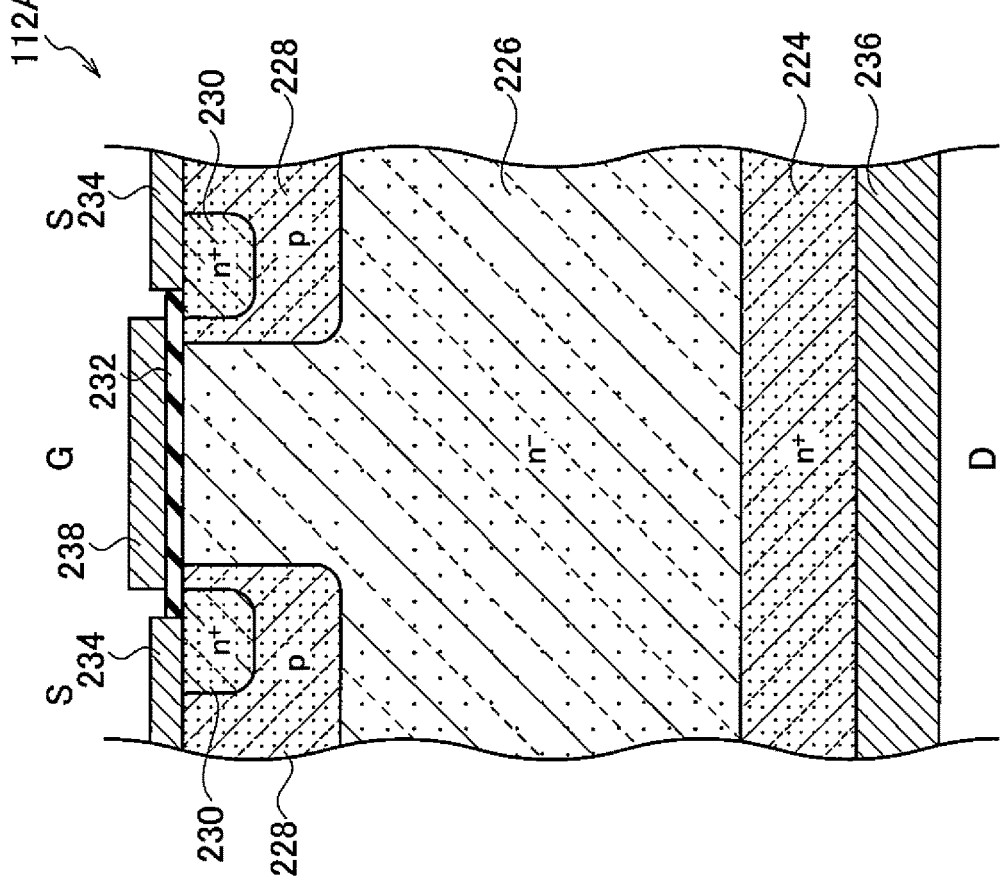
FIG. 11B is a circuit configuration diagram of an IGBT, in an example of a power chip applied to the power module apparatus according to the first embodiment.

As the power module 100 applicable to the power module apparatus 10 according to the first embodiment, FIG. 11A shows a schematic cross-sectional structure of a SiC MOSFET 112A applied as semiconductor devices Q1 and Q4, and FIG. 11B shows a schematic cross-sectional structure of the IGBT 112B.

As shown in FIG. 11A, the SiC MOSFET 112A includes: a semiconductor substrate 226 composed by including an n$^-$ type high resistivity layer; a p body region 228 formed on a front surface side of the semiconductor substrate 226; a source region 230 formed on a front side surface of the p body region 228; a gate insulating film 232 disposed on a front side surface of the semiconductor substrate 226 between the p body regions 228; a gate electrode 238 disposed on the gate insulating film 232; a source electrode 234 connected to the source region 230 and the p body region 228; an n$^+$ drain region 224 disposed on a back side surface opposite to the surface of the semiconductor substrate 226; and a drain electrode 236 connected to the n$^+$ type drain area 224. A plurality of such SiC MOSFETs 112A are formed in one chip, and are connected in parallel to one another.

Although the SiC MOSFET 112A is composed by including a planar-gate-type n channel vertical SiC MOSFET in FIG. 11A, the SiC MOSFET 112A may be composed by including a trench-gate type n channel vertical SiC TMOSFET 112C, etc., shown in FIG. 15 mentioned below.

Alternatively, a GaN-based FET etc. instead of the SiC MOSFET 112A can also be adopted to the semiconductor device (Q1, Q4) which can be applied to the power module 100 to be applied to the power module apparatus according to the first embodiment. Specifically, as the semiconductor devices Q1 and Q4 to be applied to the power module 100 applicable to the power module apparatus 10 according to the first embodiment, any one of a SiC-based or GaN-based power element can be adopted.

Furthermore, a semiconductor of which the bandgap energy is within a range from 1.1 eV to 8 eV, for example, can be used for the semiconductor devices Q1 and Q4 to be applied to the power module 100 applicable to the power module apparatus 10 according to the first embodiment. Accordingly, since a calorific value becomes large in many cases if using wideband gap semiconductors, e.g. GaN or diamond, it is especially effective.

Similarly, as the power module 100 applicable to the power module apparatus 10 according to the first embodiment, as shown in FIG. 11B, the IGBT 112B applied as semiconductor devices Q1 and Q4 includes: a semiconductor substrate 226 composed by including an n⁻ type high resistivity layer; a p body region 228 formed on a front surface side of the semiconductor substrate 226; an emitter region 230E formed on a front side surface of the p body region 228; a gate insulating film 232 disposed on a front side surface of the semiconductor substrate 226 between the p body regions 228; a gate electrode 238 disposed on the gate insulating film 232; an emitter electrode 234E connected to the emitter region 230E and the p body region 228; a p⁺ collector region 224P disposed on aback side surface opposite to the surface of the semiconductor substrate 226; and a collector electrode 236C connected to the p⁺ collector region 224P.

In FIG. 11B, although the IGBT 112B is composed by including a planar-gate-type n channel vertical IGBT, the IGBT 130B may be composed by including a trench-gate-type n channel vertical IGBT, etc.

Figure 12:
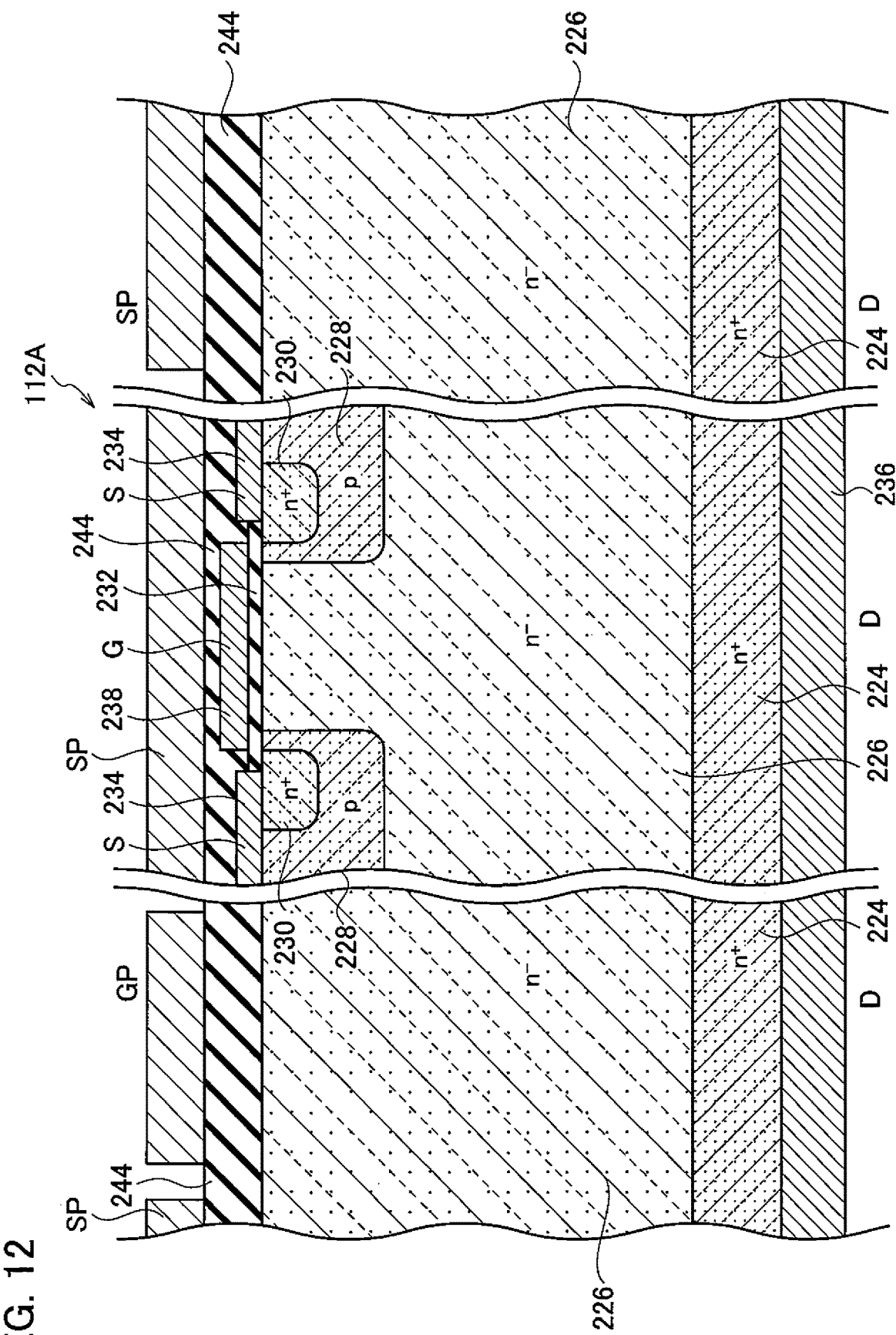
FIG. 12 is a schematic cross-sectional structure diagram of a SiC MOSFET including a source pad electrode SP and a gate pad electrode GP, in an example of a power chip applied to the power module apparatus according to the first embodiment.

As an example of the semiconductor devices Q1 and Q4 to be applied to the power module 100 applicable to the power module apparatus 10 according to the first embodiment, FIG. 12 shows a schematic cross-sectional structure of the SiC MOSFET 112A including a source pad electrode SP and a gate pad electrode GP.

The gate pad electrode GP is connected to the gate electrode 238 disposed on the gate insulating film 232, and the source pad electrode SP is connected to the source electrode 234 connected to the source region 230 and the p body region 228. Moreover, as shown in FIG. 12, the gate pad electrode GP and the source pad electrode SP are disposed on an interlayer insulating film 244 for passivation which covers the surface of the SiC MOSFET 112A.

In addition, a microstructural transistor structure (not shown) may be formed in the semiconductor substrate 226 below the gate pad electrode GP and the source pad electrode SP in the same manner as the center portion shown in FIG. 11A.

Furthermore, as shown in FIG. 12, the source pad electrode SP may be disposed to be extended onto the interlayer insulating film 244 for passivation, also in the transistor structure of the center portion.

Figure 13:
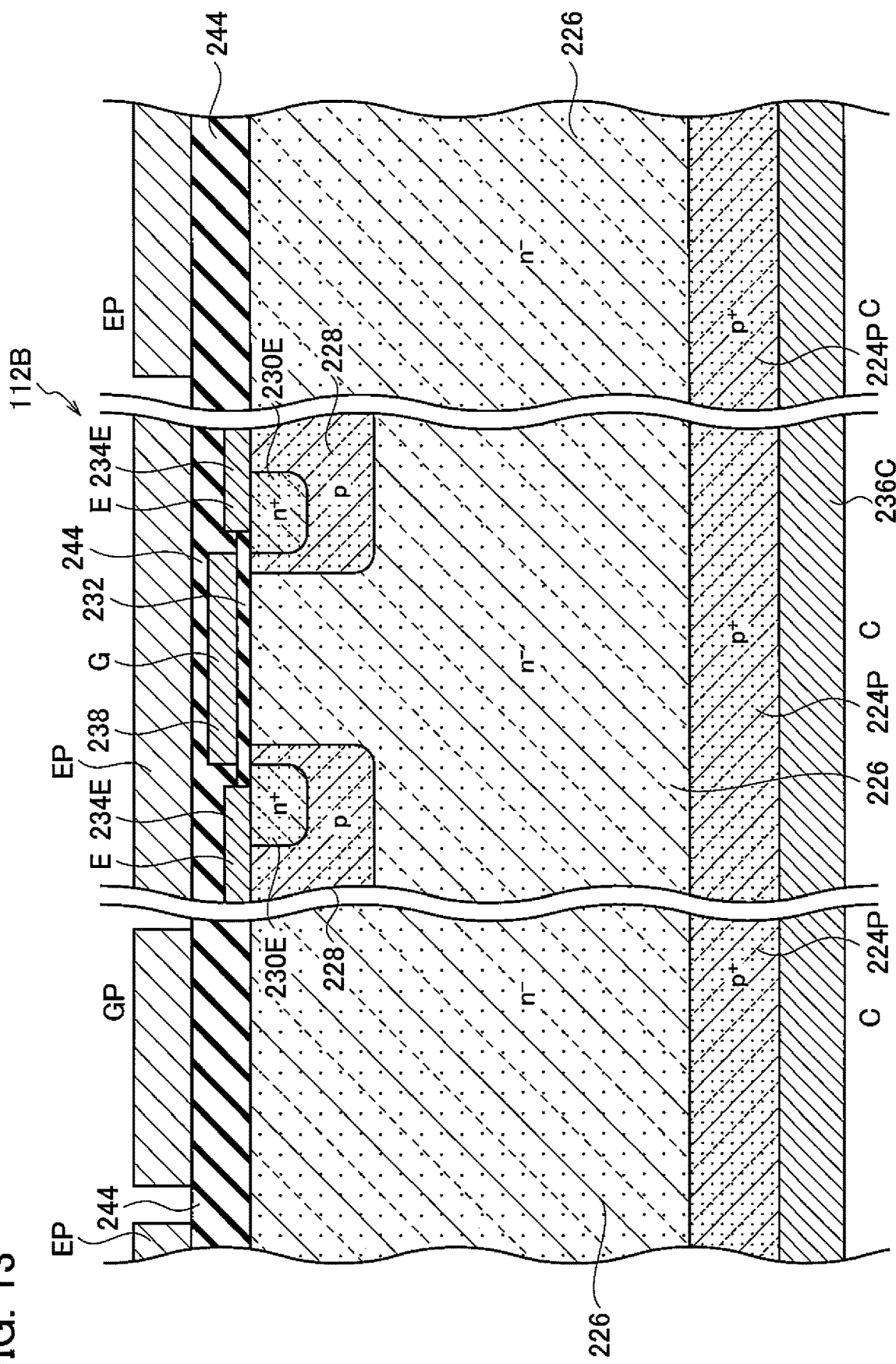
FIG. 13 is a schematic cross-sectional structure diagram of an IGBT including an emitter pad electrode EP and a gate pad electrode GP, in an example of a power chip applied to the power module apparatus according to the first embodiment.

FIG. 13 shows a schematic cross-sectional structure of an IGBT 112B including a source pad electrode SP and a gate pad electrode GP, as an example of the semiconductor devices Q1 and Q4 to be applied to the power module 100 applicable to the power module apparatus 10 according to the first embodiment.

The gate pad electrode GP is connected to the gate electrode 238 disposed on the gate insulating film 232, and the emitter pad electrode EP is connected to the emitter electrode 234E connected to the emitter region 230E and the p body region 228. Moreover, as shown in FIG. 13, the gate pad electrode GP and the emitter pad electrode EP are disposed on an interlayer insulating film 244 for passivation which covers the surface of IGBT 112B.

In addition, an IGBT transistor structure (not shown) may be formed in the semiconductor substrate 226 below the gate pad electrode GP and the emitter pad electrode EP in the same manner as the center portion shown in FIG. 11B.

Furthermore, as shown in FIG. 13, the emitter pad electrode EP may be disposed to be extended onto the interlayer insulating film 244 for passivation, also in the IGBT structure of the center portion.

SiC based power devices, e.g. SiC DIMOSFET and SiC TMOSFET, or GaN based power devices, e.g. GaN based High Electron Mobility Transistor (HEMT), are applicable as the semiconductor devices Q1 and Q4. In some instances, power devices, e.g. Si based MOSFETs and IGBT, are also applicable thereto.

—SiC Double Implanted MOSFET (SiC DIMOSFET)—

Figure 14:
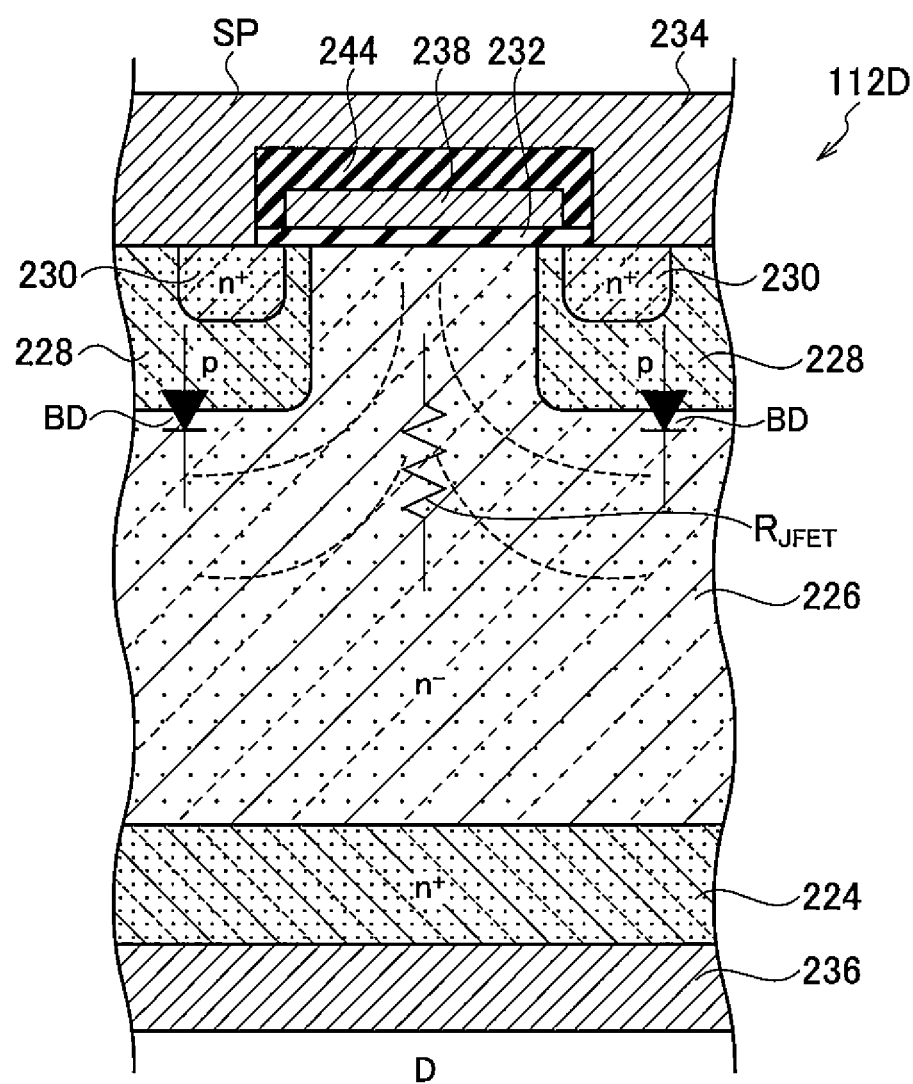
FIG. 14 is a circuit configuration diagram of a SiC Double Implanted MOSFET (SiC DIMOSFET), in an example of a power chip applied to the power module apparatus according to the first embodiment.

FIG. 14 shows a schematic cross-sectional structure of a SiC DIMOSFET 112D, as an example of the semiconductor devices Q1 and Q4 to be applied to the power module 100 applicable to the power module apparatus 10 according to the first embodiment.

As shown in FIG. 14, the SiC DIMOSFET 112D to be applied to the power module 100 applicable to the power module apparatus 10 according to the first embodiment includes: a semiconductor substrate 226 composed by including an n⁻ type high resistivity layer; a p body region 228 formed on a front surface side of the semiconductor substrate 226; an n⁺ source region 230 formed on a front side surface of the p body region 228; a gate insulating film 232 disposed on a front side surface of the semiconductor substrate 226 between the p body regions 228; a gate electrode 238 disposed on the gate insulating film 232; a source electrode 234 connected to the source region 230 and the p body region 228; an n⁺ drain region 224 disposed on a back side surface opposite to the surface of the semiconductor substrate 226; and a drain electrode 236 connected to the n⁺ type drain area 224.

In the SiC DIMOSFET 112D shown in FIG. 14, the p body region 228 and the n⁺ source region 230 formed on the front side surface of the p body region 228 are formed with double ion implantation (DI), and the source pad electrode SP is connected to the source region 230 and the source electrode 234 connected to the p body region 228.

A gate pad electrode GP (not shown) is connected to the gate electrode 238 disposed on the gate insulating film 232. Moreover, as shown in FIG. 14, the gate pad electrode GP and the source pad electrode SP are disposed on an interlayer insulating film 244 for passivation which covers the surface of the SiC DIMOSFET 112D.

As shown in FIG. 14, in the SiC DIMOSFET, since a depletion layer as shown with the dashed lines is formed in the semiconductor substrate 226 composed of a n⁻ type high resistivity layer inserted into the p body regions 228, channel resistance $R_{JFET}$ accompanying the junction type FET (JFET) effect is formed. Moreover, as shown in FIG. 14, body diodes BD are respectively formed between the p body regions 228 and the semiconductor substrates 226.

—SiC TMOSFET—

Figure 15:
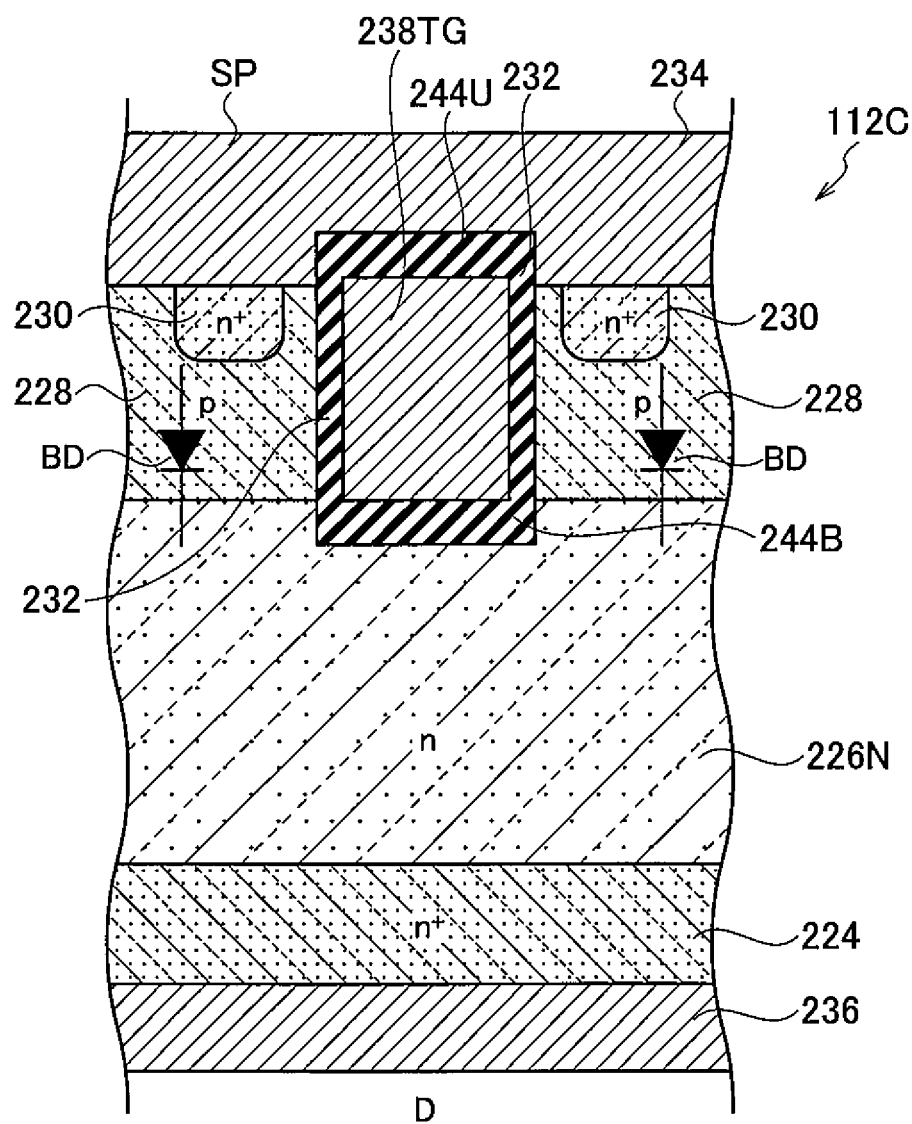
FIG. 15 is a circuit configuration diagram of a SiC Trench MOSFET (SiC TMOSFET), in an example of a power chip applied to the power module apparatus according to the first embodiment.

FIG. 15 shows a schematic cross-sectional structure of a SiC TMOSFET, as an example of the semiconductor devices Q1 and Q4 to be applied to the power module 100 applicable to the power module apparatus 10 according to the first embodiment.

As shown in FIG. 15, the SiC TMOSFET 112C to be applied to the power module 100 applicable to the power module apparatus 10 according to the first embodiment includes: a semiconductor substrate 226N composed by including an n layer; a p body region 228 formed on a front surface side of the semiconductor substrate 226N; an n⁺ source region 230 formed on a front side surface of the p body region 228; a trench gate electrode 238TG passing through the p body region 228, the trench gate electrode 238TG formed in the trench formed up to the semiconductor substrate 226N via the gate insulating film 232 and the interlayer insulating films 244U and 244B; a source electrode 234 connected to the source region 230 and the p body region 228; an n⁺ drain region 224 disposed on a back side surface opposite to the surface of the semiconductor substrate 226N; and a drain electrode 236 connected to the n⁺ type drain area 224.

In FIG. 15, a trench gate electrode 238TG passing through the p body region 228 is formed in the trench formed up to the semiconductor substrate 226N via the gate insulating film 232 and the interlayer insulating films 244U and 244B; and the source pad electrode SP is connected to the source region 230 and the source electrode 234 connected to the p body region 228.

A gate pad electrode GP (not shown) is connected to the trench gate electrode 238TG disposed on the gate insulating film 232. Moreover, as shown in FIG. 15, the gate pad electrode GP and the source pad electrode SP are disposed on an interlayer insulating film 244U for passivation which covers the surface of the SiC TMOSFET 112C.

In the SiC TMOSFET 112C, channel resistance $R_{JFET}$ accompanying the junction type FET (JFET) effect as the SiC DIMOSFET 112D is not formed. Moreover, body diodes BD are respectively formed between the p body regions 228 and the semiconductor substrates 226N, in the same manner as FIG. 14.

Although the detailed description is omitted, also the case of the power modules 100A and 100B applicable to the power module apparatus 10 according to the first and second modified examples of the first embodiment is the same as the case of the above-mentioned power module 100, except for the structure of the heat radiators 42 and 44.

Second Embodiment (Power Module Apparatus)

FIG. 16A shows a planar structure of a power module apparatus 10A according to a second embodiment, and FIG. 16B shows a schematic cross-sectional structure of the power module apparatus 10A taken in the line III-III of FIG. 16A. Moreover, FIG. 17 shows a planar structure of the cooling device 30A applicable to the power module apparatus 10A according to the second embodiment.

Figure 17:
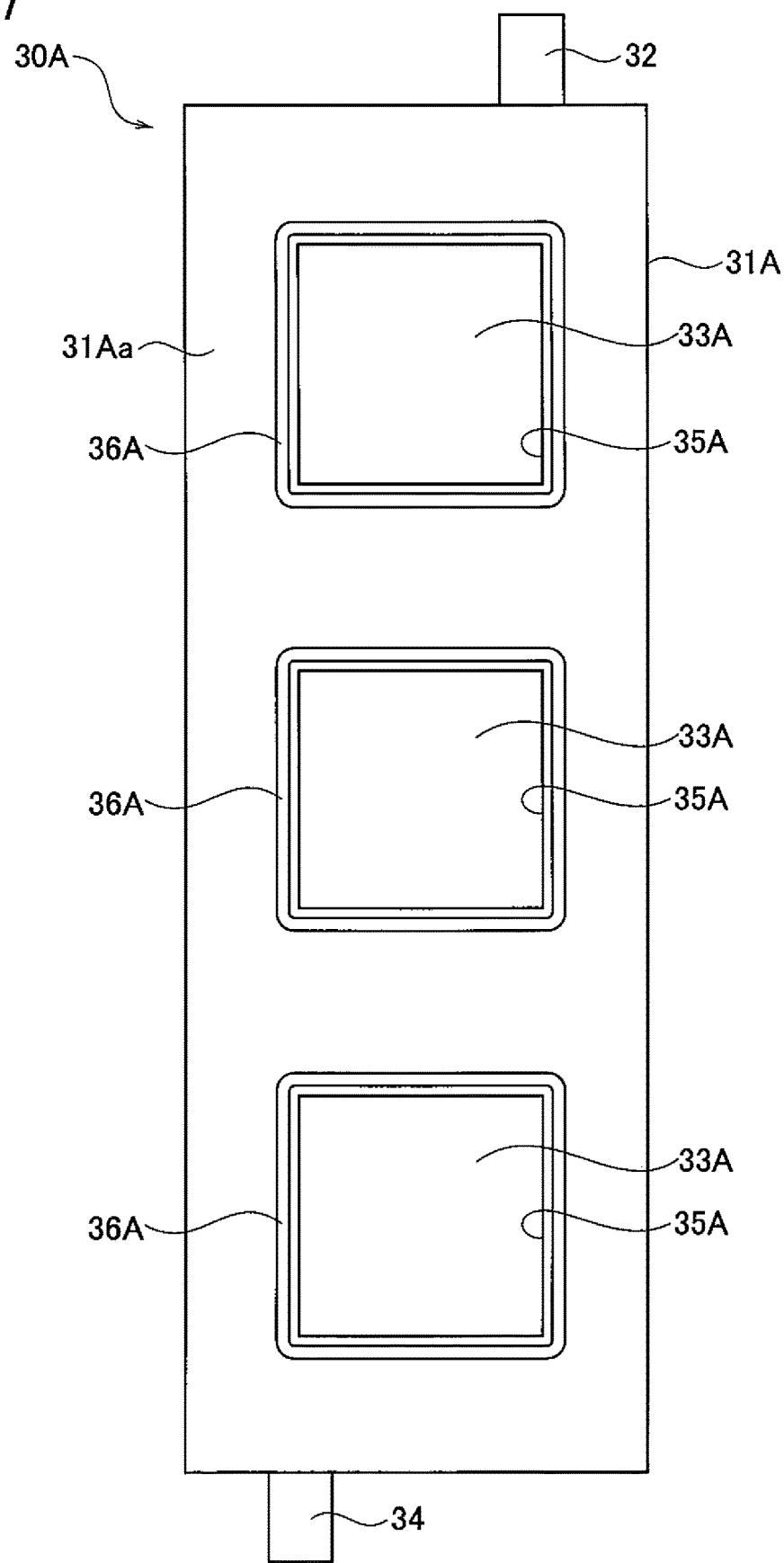
FIG. 17 is a top view diagram showing a schematic structure of a cooling device applied to the power module apparatus according to the second embodiment.

As shown in FIG. 17, in the cooling device 30A, a cooling body unit 31A is formed in a reed shape (rectangle shape) shown in planar view. Moreover, three openings 35A respectively including groove portions 36A for O ring are linearly arranged between an inlet port 32 and an outlet port 34 for coolant water so that a coolant passage 33A is exposed from each of the openings 35A to a mounting portion (upper surface portion) 31Aa side.

Since a configuration of the power module 100 applicable to the power module apparatus 10A according to the second embodiment is fundamentally the same as that of the above-mentioned power module 100 according to the first embodiment, the detailed description is omitted.

More specifically, as shown in FIGS. 16A and 16B, the power module apparatus 10A according to the second embodiment corresponds to an example of attaching three 2-in-1 type power modules 100, 100 and 100 having the identical configuration onto the cooling device 30A in order to form a three-phase AC inverter (6-in-1 type power module). Also in the case of this example, in each power module 100, the heat radiator 40 is attached thereto so that a height (ha) from a lowermost portion of the coolant passage 33A to an uppermost portion thereof and a height (hb) from the lowermost portion of the coolant passage 33A to a base edge FB is substantially identical to each other. Thereby, the power modules 100 in which the heat radiators 40 are respectively attached to the plurality of the openings 35A formed at the upper surface portion of the cooling device 30A can also be efficiently cooled, and thereby it becomes possible to reduce degradation due to overheating.

In addition, the power module 100 applicable to the power module apparatus 10A according to the second embodiment can also have a configuration (integral-type gate drive substrate) with which the gate drive substrate 20 included in each power module 100 is integrated.

Moreover, it is applicable not only to the power module 100 but also to the power modules 100A and 100B, similarly.

(Example of Application)

Figure 18A:
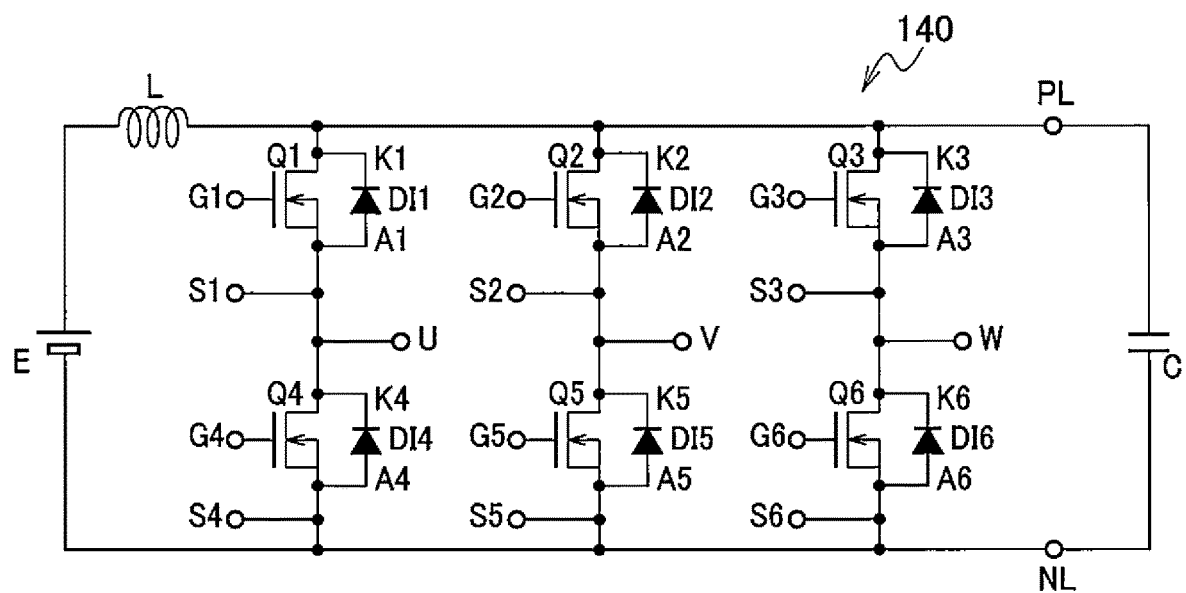
FIG. 18A shows an example of a circuit configuration in which the SiC MOSFET is applied as a semiconductor device, and a snubber capacitor is connected between a power terminal PL and an earth terminal (ground terminal) NL, in a circuit configuration of a three-phase alternating current (AC) inverter (6-in-1 module) composed by including the power module apparatus according to the second embodiment.

FIG. 18A shows an example of a circuit configuration in which the SiC MOSFET is applied as a semiconductor device, and a snubber capacitor C is connected between the power terminal PL and the earth terminal (ground terminal) NL, in a three-phase AC inverter 140 composed using the power module apparatus 10A according to the second embodiment.

Figure 18B:
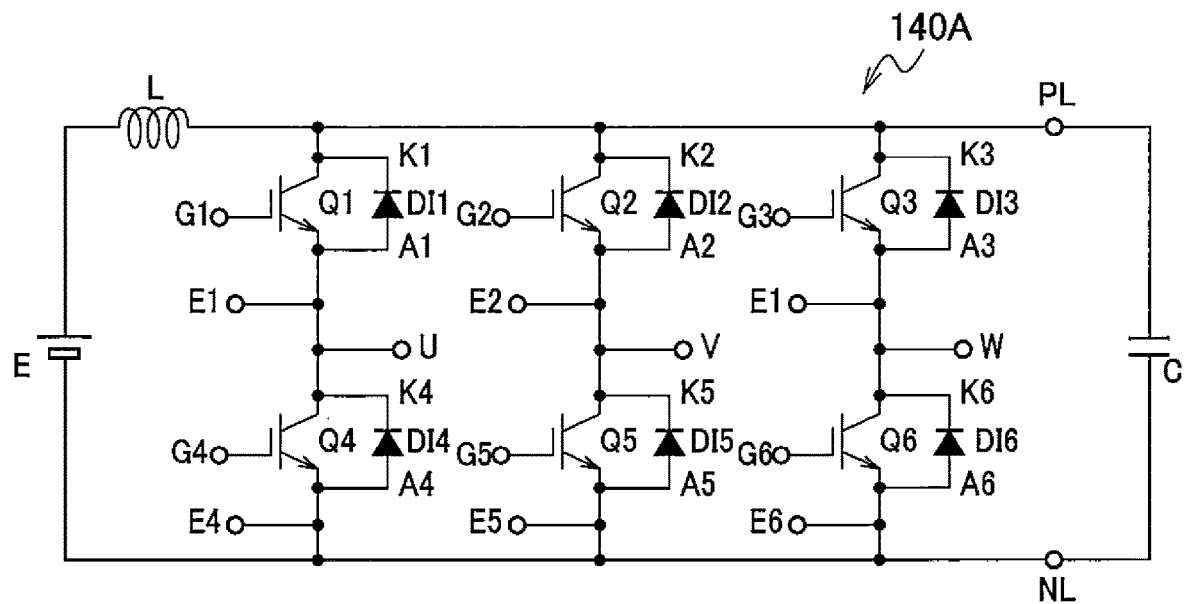
FIG. 18B shows an example of a circuit configuration in which the IGBT is applied as a semiconductor device, and a snubber capacitor is connected between a power terminal PL and an earth terminal (ground terminal) NL, in a circuit configuration of a three-phase AC inverter (6-in-1 module) composed by including the power module apparatus according to the second embodiment.

Similarly, FIG. 18B shows an example of a circuit configuration in which the IGBT is applied as a semiconductor device, and a snubber capacitor C is connected between the power terminal PL and the earth terminal (ground terminal) NL, in the three-phase AC inverter 140A composed using the power module apparatus 10A according to the second embodiment.

Since a switching speed of the SiC MOSFET or IGBT is fast when connecting the power module apparatus 10A according to the second embodiment to a power source E, large surge voltage Ldi/dt is produced due to an inductance L which the connection line has. For example, the surge voltage Ldi/dt is expressed as follows: $Ldi/dt=3\times10^9$ (A/s), where a current change di=300 A, and a time variation accompanying switching dt=100 ns.

Although a value of the surge voltage Ldi/dt changes dependent on a value of the inductance L, the surge voltage Ldi/dt is superimposed on the power source E. Such a surge voltage Ldi/dt can be absorbed or suppressed by the snubber capacitor C connected between the power terminal PL and the earth terminal (ground terminal) NL.

Concrete Example

Next, there will now be explained the three-phase AC inverter application circuit 140 composed using the power module apparatus 10A according to the second embodiment to which the SiC MOSFET is applied as the semiconductor device, with reference to FIG. 19.

Figure 19:
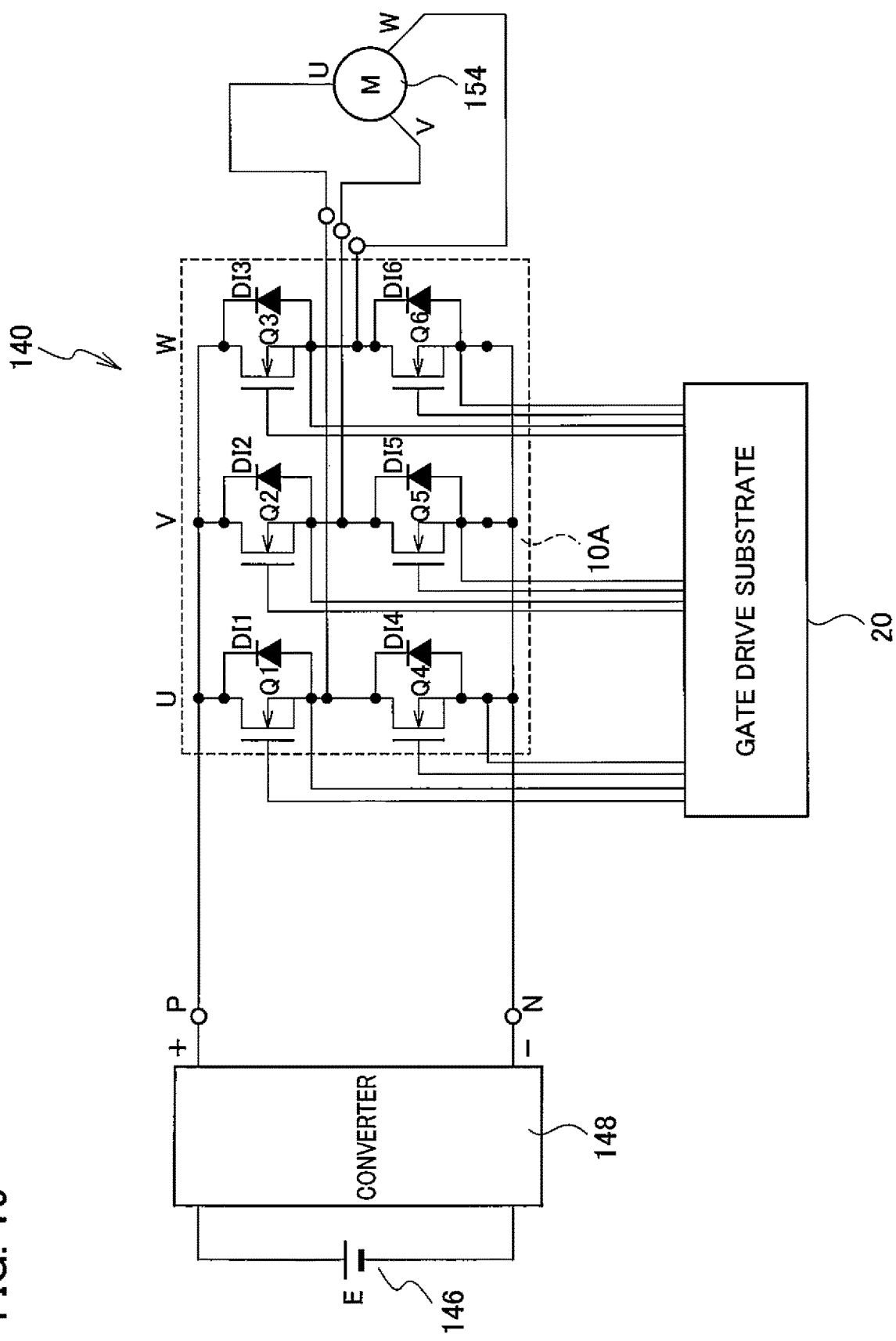
FIG. 19 is an application circuit configuration diagram of a three-phase AC inverter composed by applying the SiC MOSFET, in an example of the power module apparatus according to the second embodiment.

As shown in FIG. 19, the three-phase AC inverter application circuit 140 includes a gate drive substrate 20, the power module apparatus 10A connected to the gate drive substrate 20, and a three-phase AC motor unit 154. U-phase, V-phase, and W-phase inverters are respectively connected to the three-phase AC motor unit 154 so as to correspond to U phase, V phase, and W phase of the three-phase AC motor unit 154, in the power module apparatus 10A.

Each output from each gate drive substrate 20 is supplied to a gate electrode of each of the SiC MOSFETs Q1 and Q4, SiC MOSFETs Q2 and Q5, and the SiC MOSFETs Q3 and Q6.

The power module apparatus 10A includes the SiC MOSFETs (Q1 and Q4), (Q2 and Q5), and (Q3 and Q6) having inverter configurations connected between a positive terminal (+) and a negative terminal (−) to which the converter 148 in a power supply or a storage battery (E) 146 is connected. Moreover, flywheel diodes DI1 to DI6 are respectively connected reversely in parallel between the source and the drain of the SiC MOSFETs Q1 to Q6.

Next, there will now be explained the three-phase AC inverter application circuit 140A composed using the power module apparatus 10A according to the second embodiment to which the IGBT is applied as the semiconductor device, with reference to FIG. 20.

Figure 20:
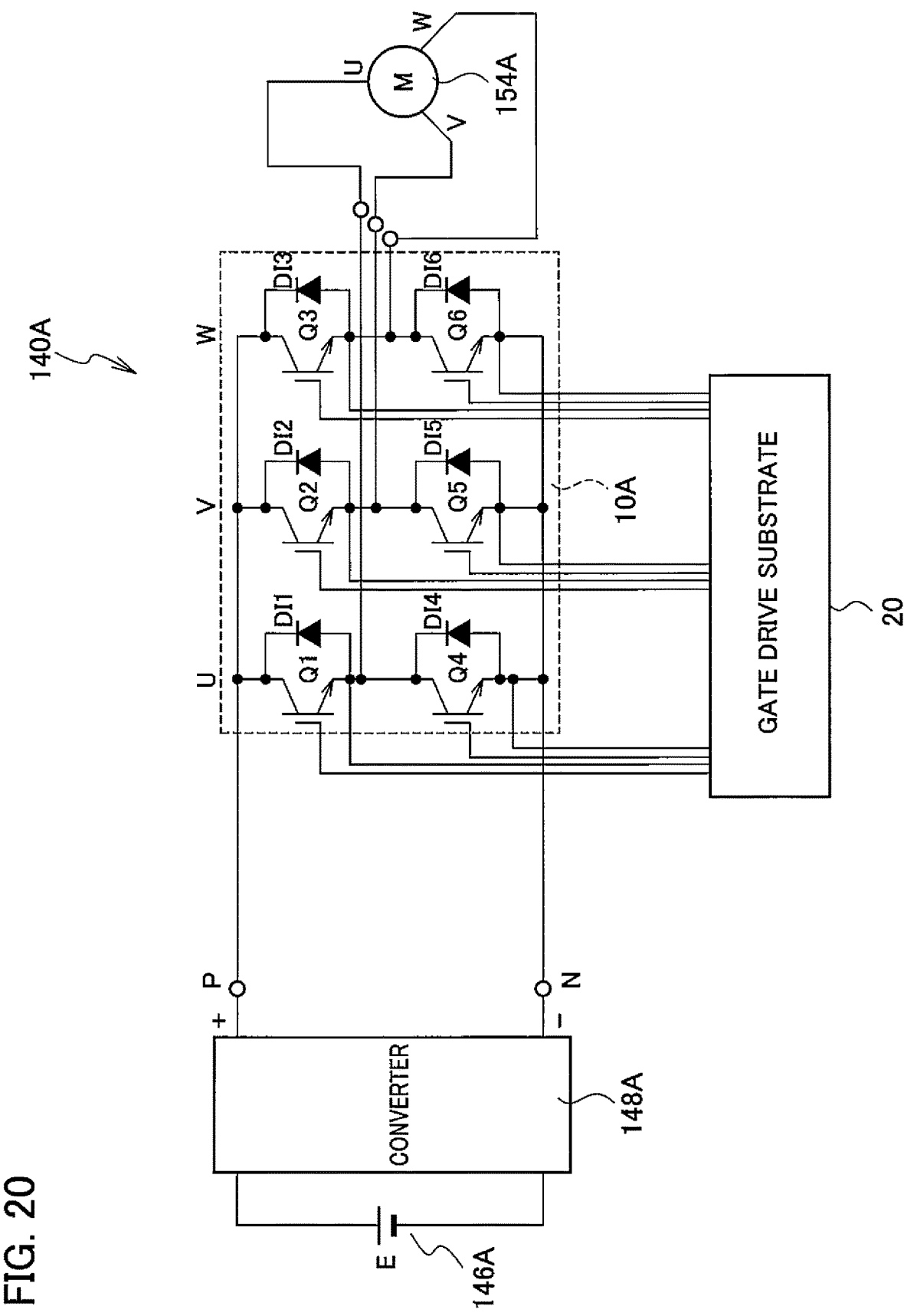
FIG. 20 is an application circuit configuration diagram of a three-phase AC inverter composed by applying the IGBT, in an example of the power module apparatus according to the second embodiment.

As shown in FIG. 20, the three-phase AC inverter application circuit 140A includes a gate drive substrate 20, the power module apparatus 10A connected to the gate drive substrate (control circuit board) 20, and a three-phase AC motor unit 154A. U-phase, V-phase, and W-phase inverters are respectively connected to the three-phase AC motor unit 154A so as to correspond to U phase, V phase, and W phase of the three-phase AC motor unit 154A, in the power module apparatus 10A.

Each output from each gate drive substrate 20 is supplied to a gate electrode of each of the IGBTs Q1 and Q4, IGBTs Q2 and Q5, and the IGBTs Q3 and Q6.

The power module apparatus 10A includes the IGBTs (Q1 and Q4), (Q2 and Q5), and (Q3 and Q6) having inverter configurations connected between a positive terminal (+) and a negative terminal (−) to which the converter 148A in a storage battery (E) 146A is connected. Moreover, flywheel diodes DI1 to DI6 are respectively connected reversely in parallel between the emitter and the collector of the IGBTs Q1 to Q6.

Third Embodiment (Cooling Structure)

Figure 21:
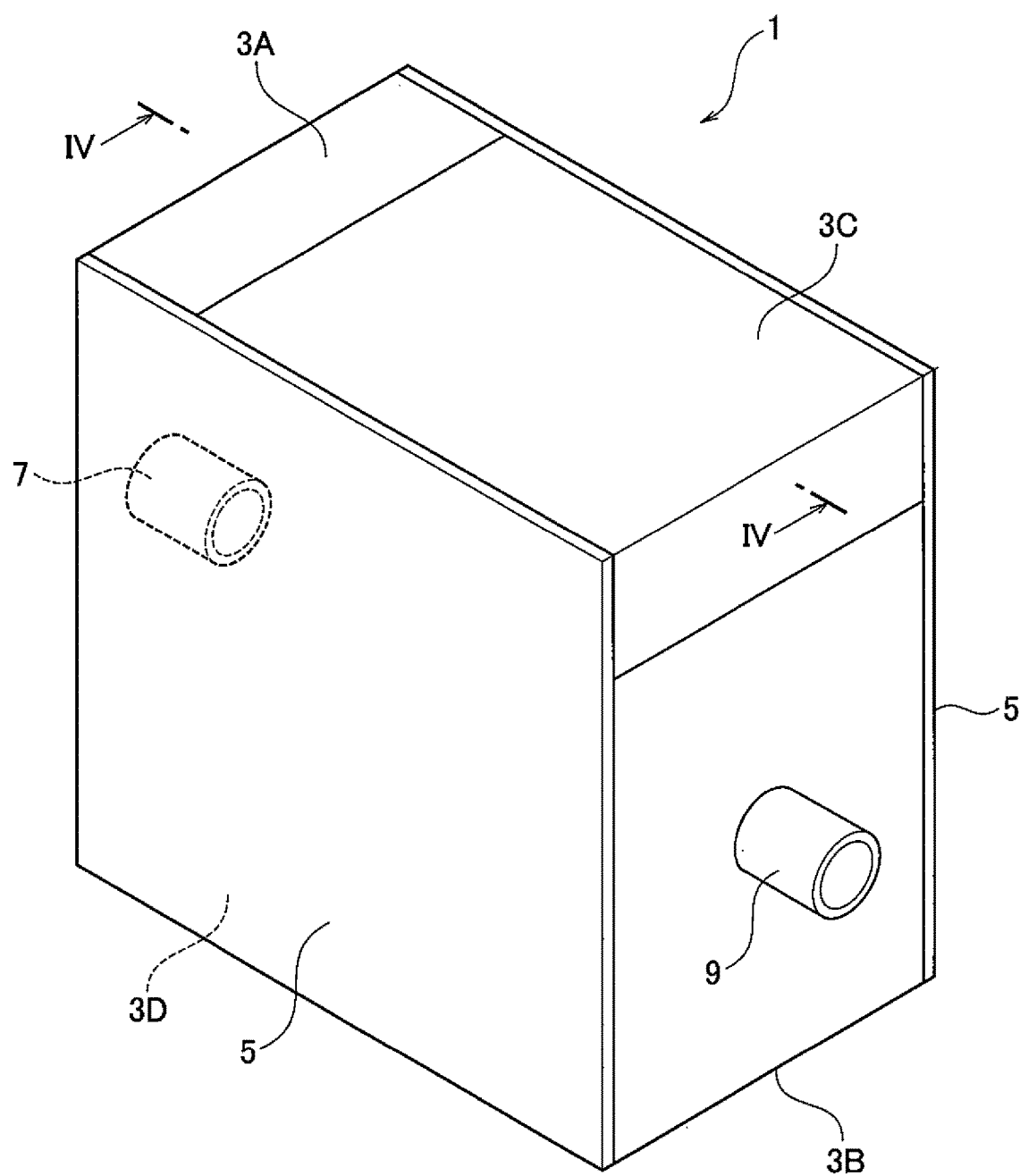
FIG. 21 is a bird's-eye view showing a schematic structure of a cooling structure according to a third embodiment.

FIG. 21 shows a bird's-eye view structure of a cooling structure 1 according to a third embodiment. Moreover, FIG. 22 shows a schematic cross-sectional structure of the cooling structure 1 taken in the line IV-IV of FIG. 21.

As shown in FIG. 21, the cooling structure 1 according to the third embodiment is a structure of three-dimensionally combining a plurality of power modules and cooling body blocks (cooling body units), each of which is unitized and includes a cooling device, for example; and the cooling body blocks are connected to one another so that coolant passages are connected with one another.

Figure 22:
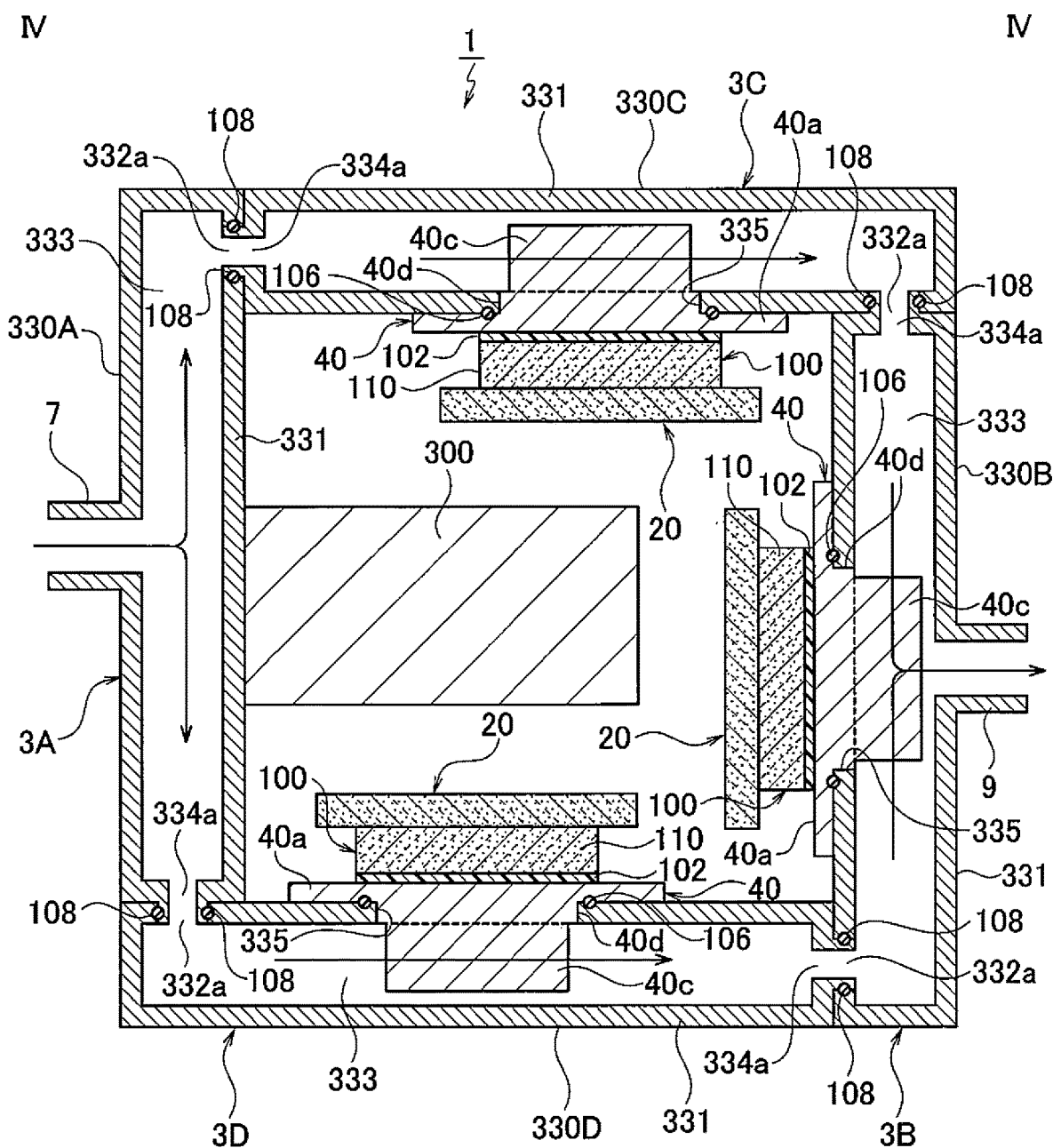
FIG. 22 is a schematic cross-sectional structure diagram showing the schematic structure of the cooling structure according to the third embodiment, taken in the line IV-IV of FIG. 21.
Figure 23:
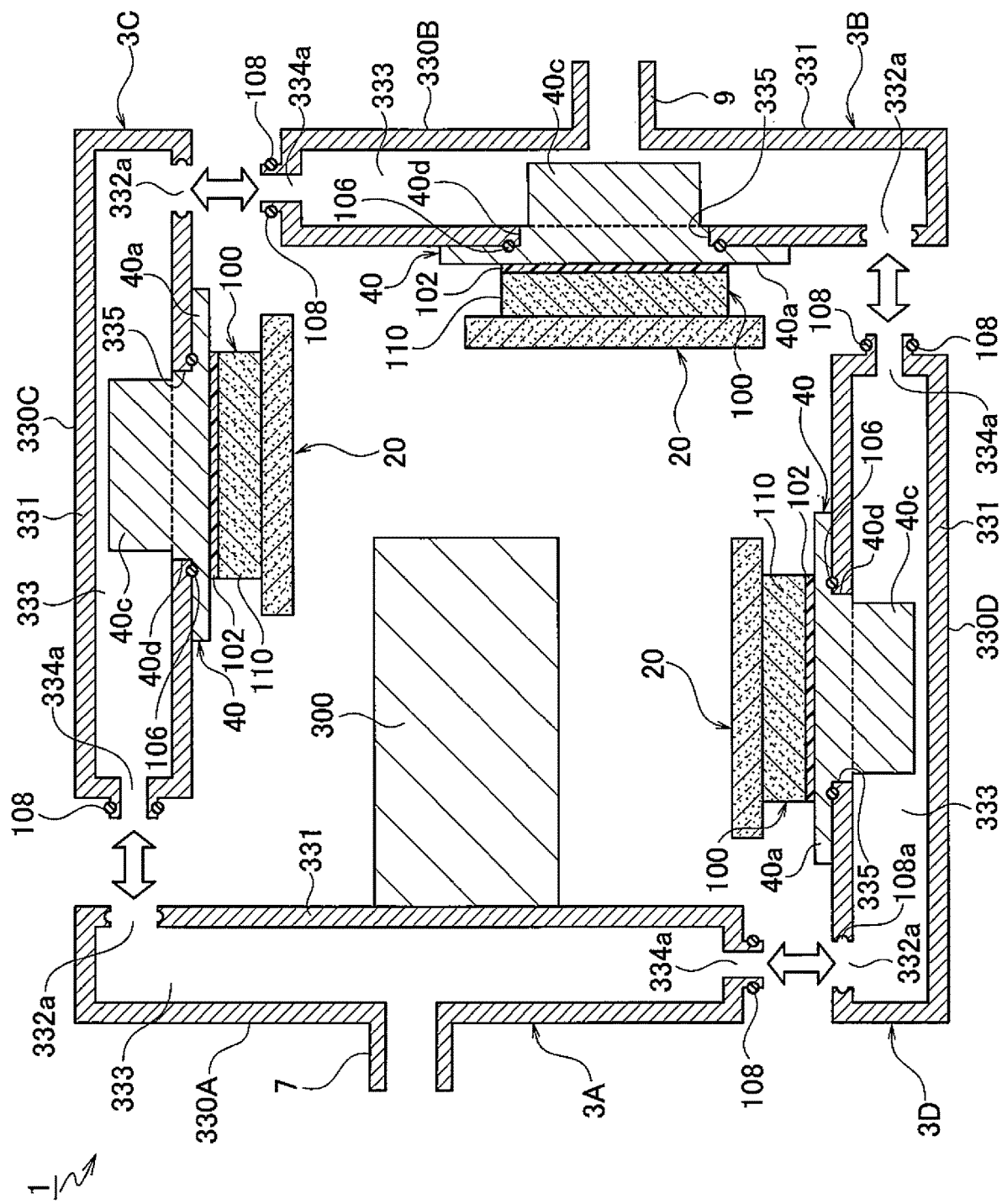
FIG. 23 is an assembly diagram corresponding to FIG. 22, for showing an assembly process of cooling body blocks of the cooling structure according to the third embodiment.

More specifically, as shown in FIG. 22, the cooling structure 1 according to the third embodiment is configured so that four cooling body blocks 3A to 3D are assembled in a rectangular frame-like shape. In this case, in the cooling body blocks 3A to 3D, as shown in FIG. 23, for example, an outlet port 334a of the cooling body block 3A is connected to an inlet port 332a of the cooling body block 3D, an outlet port 334a of the cooling body block 3D is connected to an inlet port 332a of a cooling body block 3B, an outlet port 334a of the cooling body block 3B is connected to an inlet port 332a of the cooling body block 3C, and an outlet port 334a of the cooling body block 3C is connected to an inlet port 332a of the cooling body block 3A. Between the respective cooling body blocks 3A, 3B, 3C, and 3D, the outlet ports 334a and the inlet port 332a are respectively connected to one another water-tightly with the O rings 108.

In order to realize more firmly connecting, a connecting portion between the cooling body block 3A and the cooling body block 3D, a connecting portion between the cooling body block 3D and the cooling body block 3B, a connecting portion between the cooling body block 3B and the cooling body block 3C, and a connecting portion between the cooling body block 3C and the cooling body block 3A may be fixed, by means of an L-shaped fastener (not shown) etc., for example.

Moreover, a water injection port (injection port) 7 for injecting coolant water in the coolant passage 333 is provided at the cooling body block 3A, and a water discharge port (discharge port) 9 for discharging the coolant water which flows through an inside of the coolant passage 333 is provided at the opposite cooling body block 3B.

Accordingly, as shown with the arrows in FIG. 22, the coolant water injected from the water injection port 7 of the cooling body block 3A passes through the coolant passage 333 of the cooling body block 3C and/or the coolant passage 333 of the cooling body block 3D from the coolant passage 333 of the cooling body block 3A, and then is discharged from the water discharge port 9 of the cooling body block 3B after passing through the coolant passage 333 of the cooling body block 3B. When the coolant water passes through each coolant passage 333 of the cooling body blocks 3A, 3B, and 3C and 3D, heat generated from each power module 100 is absorbed.

In addition, the cooling structure 1 according to the third embodiment includes a side surface cover 5 provided so as to cover the cooling body blocks 3A to 3D, as shown in FIG. 21. The side surface cover 5 is attached thereto after the cooling body blocks 3A to 3D are assembled.

For example, when the three-phase AC inverter is composed by using the cooling structure 1 according to the third embodiment, the cooling body blocks 3B to 3D are used for the power modules, and the cooling body block 3A is used for capacitor module.

Figure 24A:
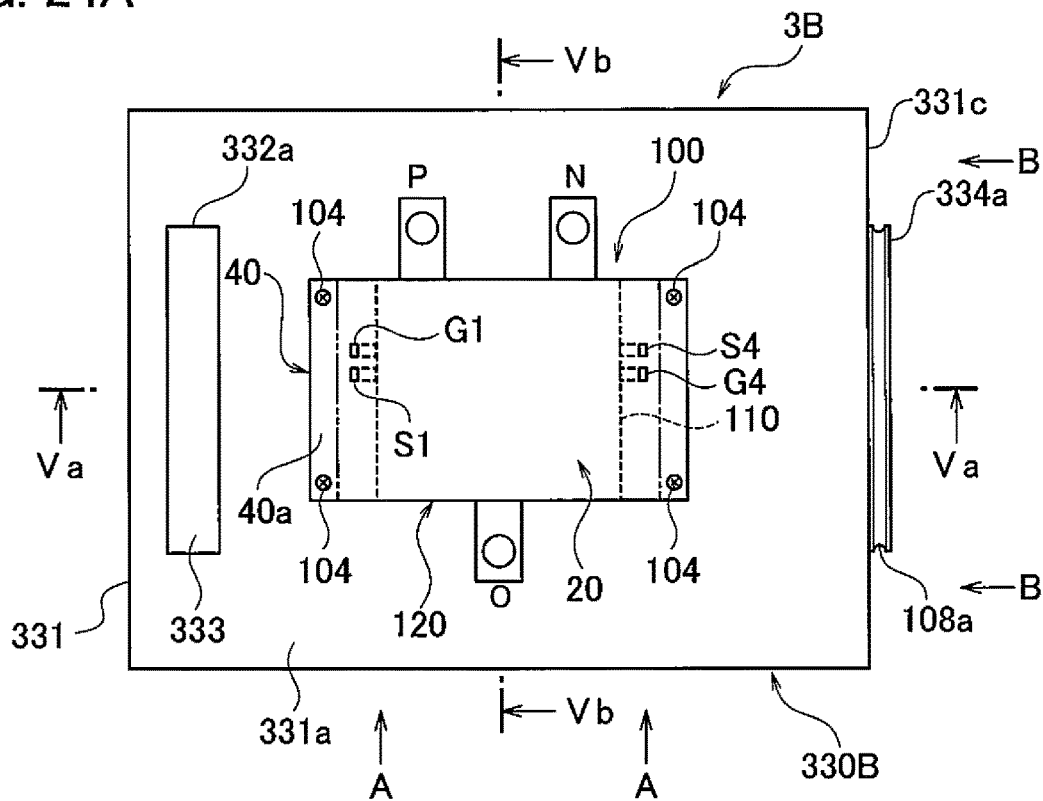
FIG. 24A is a top view diagram of a cooling body block for power module, for showing a schematic structure of the cooling body block applied to the cooling structure according to the third embodiment.
Figure 24B:
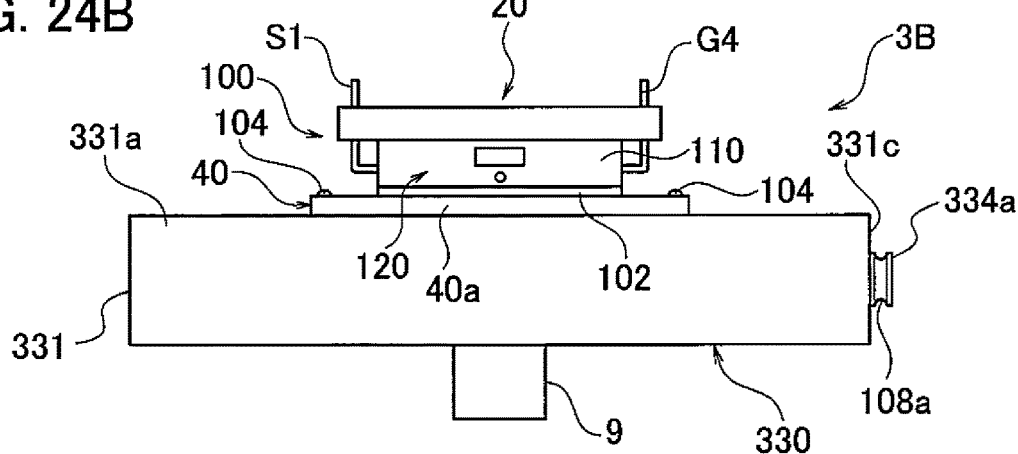
FIG. 24B is a front view diagram of the cooling body block for power module, for showing the schematic structure of the cooling body block applied to the cooling structure according to the third embodiment.
Figure 24C:
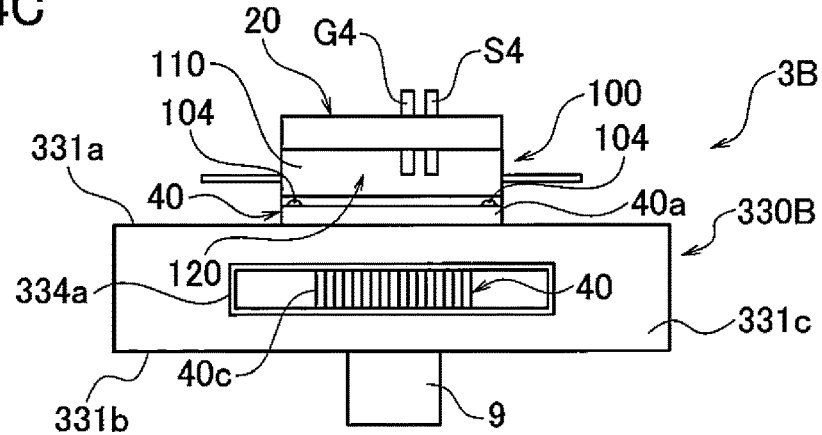
FIG. 24C is a side view diagram of the cooling body block for power module, for showing the schematic structure of the cooling body block applied to the cooling structure according to the third embodiment.
Figure 25A:
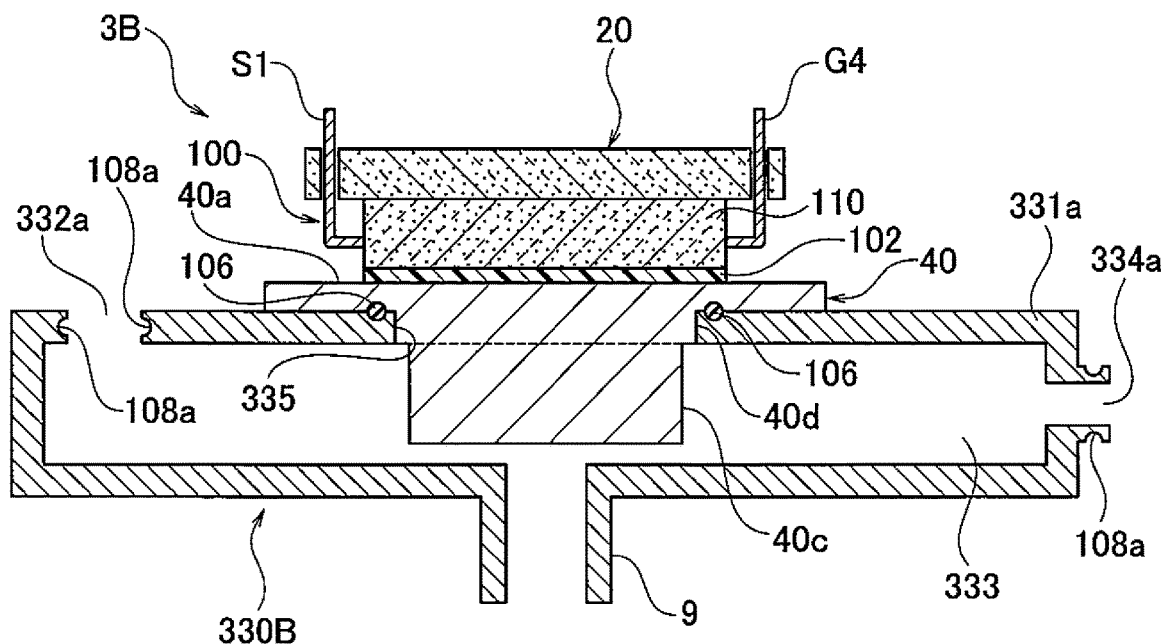
FIG. 25A is a schematic cross-sectional structure diagram of the cooling body block for power module taken in the line Va-Va of FIG. 24A, for showing a schematic structure of the power module and the cooling body block applied to the cooling structure according to the third embodiment.
Figure 25B:
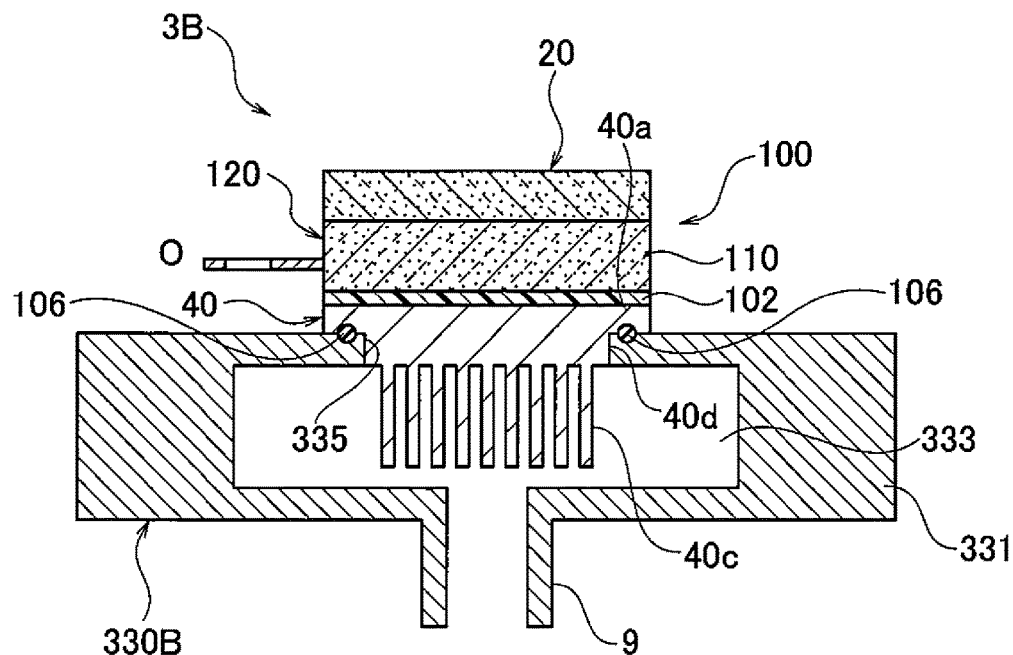
FIG. 25B is a schematic cross-sectional structure diagram of the cooling body block for power module taken in the line Vb-Vb of FIG. 24A, for showing the schematic structure of the power module and the cooling body block applied to the cooling structure according to the third embodiment.
Figure 26A:
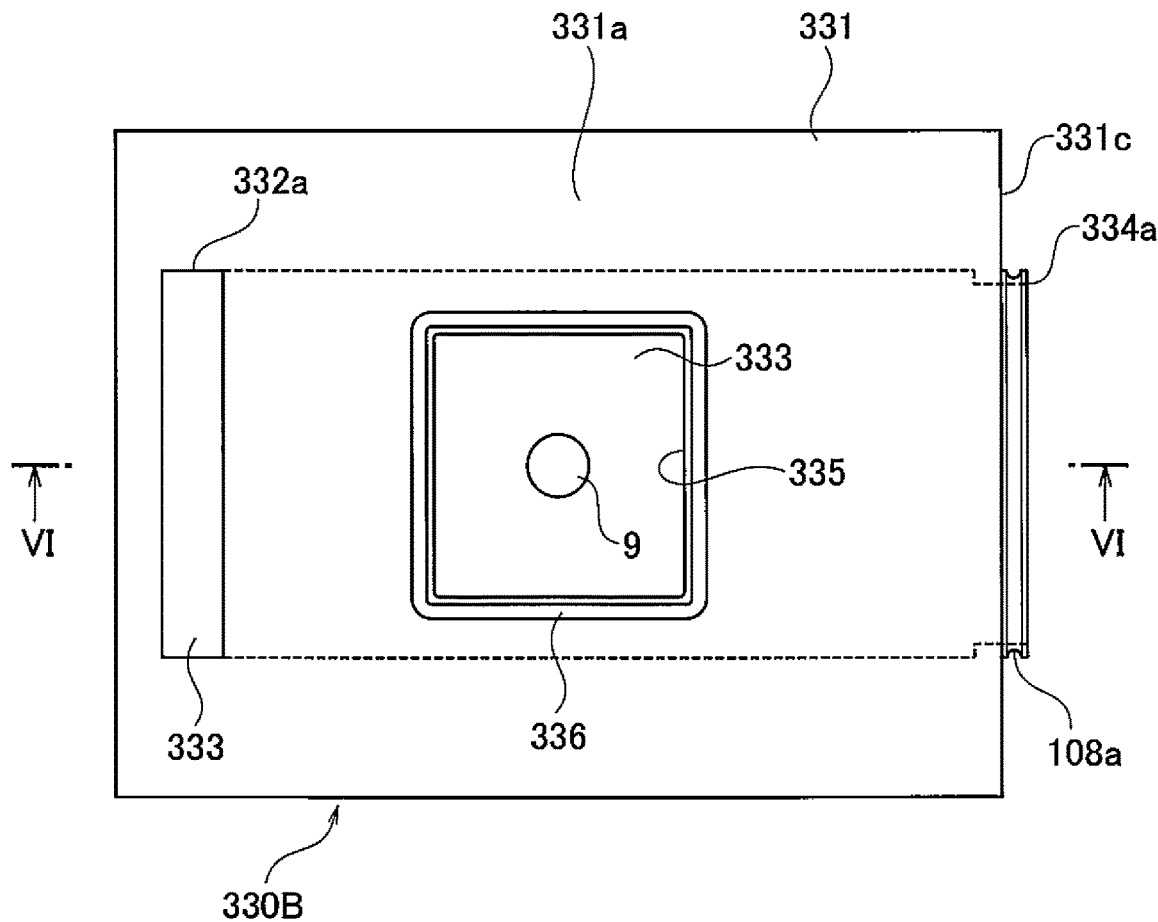
FIG. 26A is a top view diagram of a cooling device, for showing a schematic structure of the cooling device applicable to the cooling body block for power module to be applied to the cooling structure according to the third embodiment.
Figure 26B:
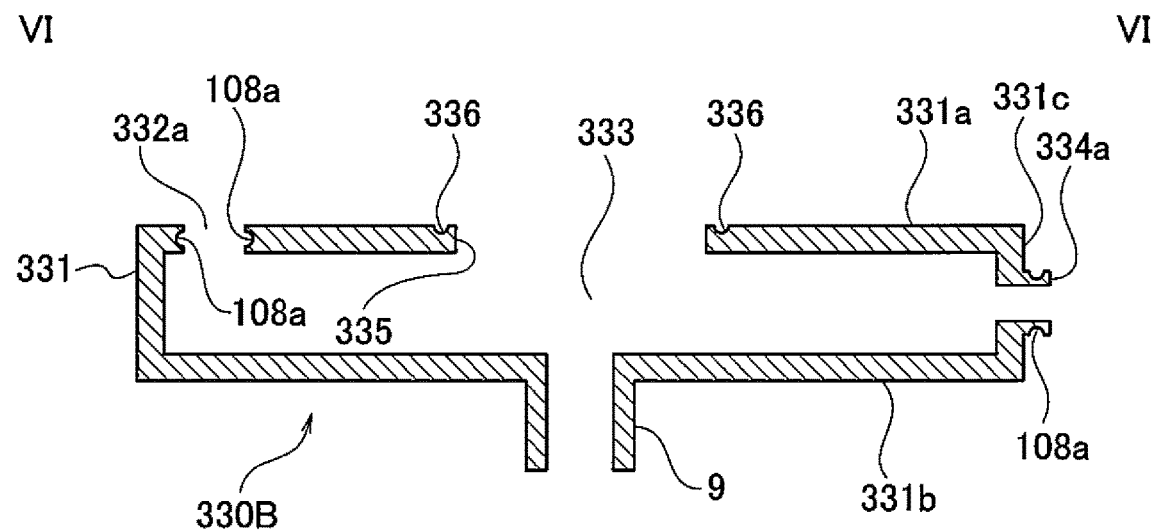
FIG. 26B is a schematic cross-sectional structure diagram of the cooling device taken in the line VI-VI of FIG. 26A, for showing the schematic structure of the cooling device applicable to the cooling body block for power module to be applied to the cooling structure according to the third embodiment.

FIG. 24A shows a plane configuration of a cooling body block (used for power modules) 3B which composes the cooling structure 1 according to the third embodiment, FIG. 24B shows a side surface configuration of the cooling body block 3B in the direction of the illustrated arrow A, and FIG. 24C shows a side surface configuration of the cooling body block 3B in the direction of the illustrated arrow B. Moreover, FIG. 25A shows a schematic cross-sectional structure taken in the line Va-Va of FIG. 24A, and FIG. 25B shows a schematic cross-sectional structure taken in the line Vb-Vb of FIG. 24A As shown in FIGS. 24 and 26, a cooling device 330B in the cooling body block 3B includes: an inlet port 332a configured to take the coolant water to be supplied to a coolant passage 333, the inlet port 332a being provided on a mounting portion (upper surface portion) 331a of the cooling body unit 331 to which the power module 100 is attached, the cooling body unit 331 having a box-like rectangular parallelepiped shape including the coolant passage 333; and an opening 335 including a groove portion 336 for O ring. Moreover, the outlet port 334a connected to the inlet port 332a of the cooling body block 3C is provided at a bonded surface portion 331c of the cooling body unit 331 to the adjacent cooling body block 3C. A groove portion 108a for the O ring 108 is provided at an inner peripheral surface of the inlet port 332a, and a groove portion 108a for the O ring 108 is provided at a perimeter surface of the outlet port 334a.

Furthermore, the water discharge port 9 for discharging the coolant water out of the coolant passage 333 is provided at a surface 331b opposite to the mounting portion 331a of the cooling body unit 331.

Since other configurations are the same as those of the power module apparatus 10 shown in the above-mentioned first embodiment, detailed explanation is omitted.

Since the configurations of the cooling body blocks 3C and 3D the cooling devices 330C and 330D are the same as those of the cooling device 330B of the cooling body block 3B other than not providing the water discharge port 9, detailed explanation is omitted.

Moreover, although a wall thickness of a part of the side surface of the cooling body unit 331 is thick, in the cross section shown in FIG. 25B, the wall thickness of the coolant passage 333 may be formed so as to become uniform in all portions.

Figure 27A:
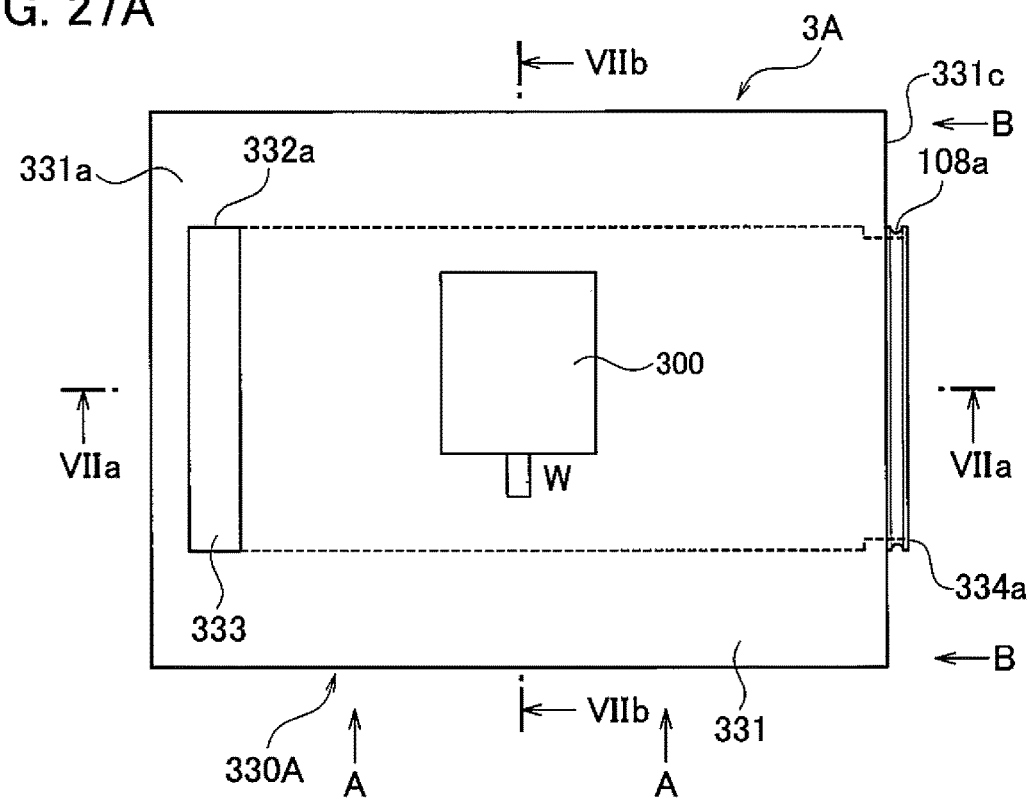
FIG. 27A is a top view diagram of a cooling body block for capacitor modules, for showing a schematic structure of the cooling body block applied to the cooling structure according to the third embodiment.
Figure 27B:
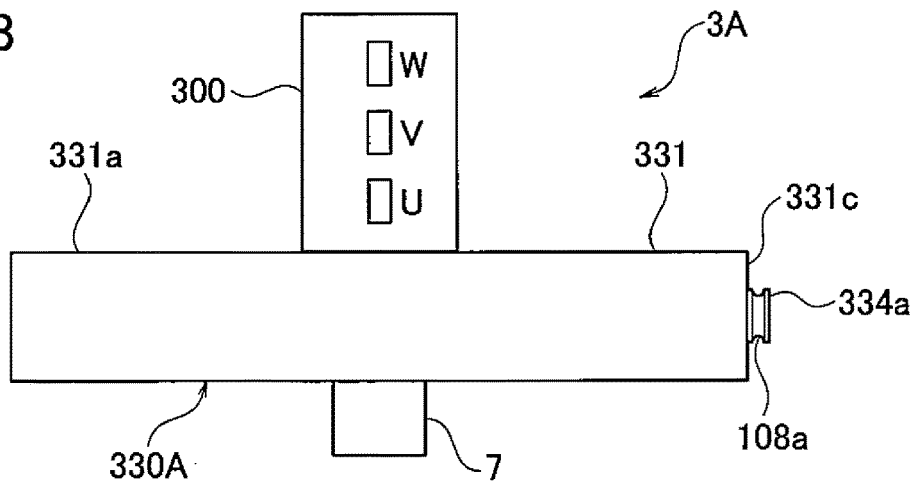
FIG. 27B is a front view diagram of the cooling body block for capacitor modules, for showing the schematic structure of the cooling body block applied to the cooling structure according to the third embodiment.
Figure 27C:
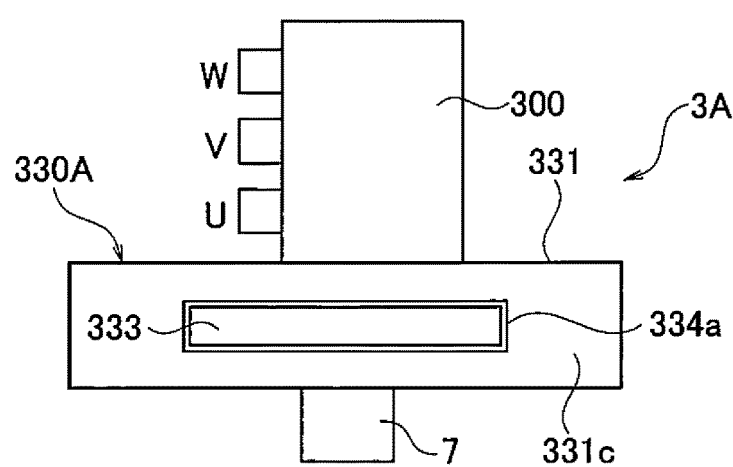
FIG. 27C is a side view diagram of the cooling body block for capacitor modules, for showing the schematic structure of the cooling body block applied to the cooling structure according to the third embodiment.
Figure 28A:
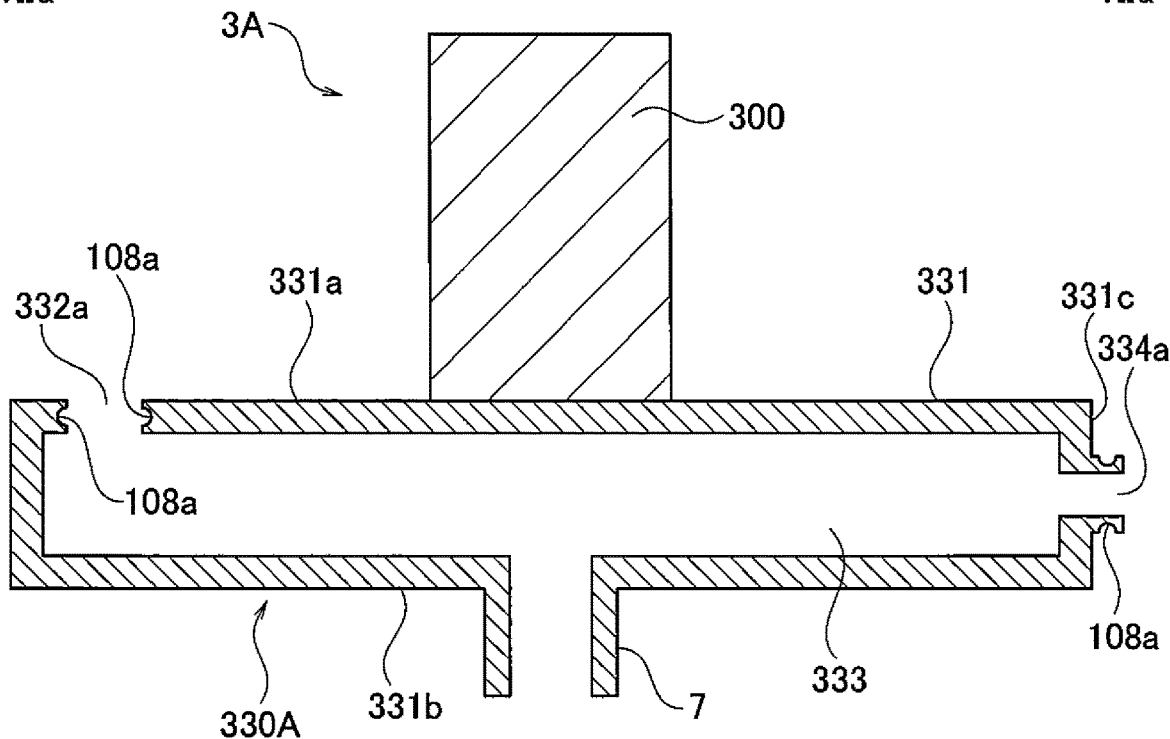
FIG. 28A is a schematic cross-sectional structure diagram of the cooling body block for power module taken in the line VIIa-VIIa of FIG. 27A, for showing a schematic structure of the cooling body block applied to the cooling structure according to the third embodiment.
Figure 28B:
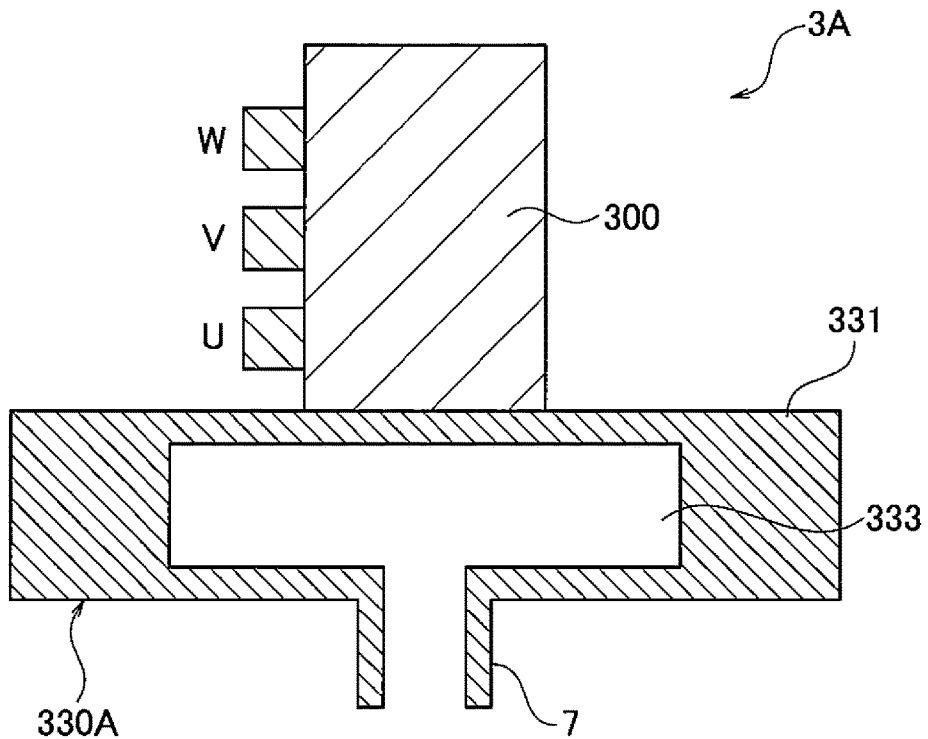
FIG. 28B is a schematic cross-sectional structure diagram of the cooling body block for power module taken in the line VIIb-VIIb of FIG. 27A, for showing a schematic structure of the cooling body block applied to the cooling structure according to the third embodiment.

FIG. 27A shows a plane configuration of a cooling body block (used for capacitor modules) 3A composing the cooling structure 1 according to the third embodiment, FIG. 27B shows a side surface configuration of the cooling body block 3A in the direction of the illustrated arrow A, and FIG. 27C shows a side surface configuration of the cooling body block 3A in the direction of the illustrated arrow B. Moreover, FIG. 28A shows a schematic cross-sectional structure taken in the line VIIa-VIIa of FIG. 27A, and FIG. 28B shows a schematic cross-sectional structure taken in the line VIIb-VIIb of FIG. 27A.

As shown in FIGS. 27 and 28, in the cooling body block 3A, the cooling device 330A includes an inlet port 332a provided at the mounting portion 331a of the cooling body unit 331 having a box-like rectangular parallelepiped shape including the coolant passage 333, the inlet port 332a configured to take in the coolant water to be supplied to the coolant passage 333. Moreover, the outlet port 334a connected to the inlet port 332a of the cooling body block 3D is provided in a bonded surface portion 331c of the cooling body unit 331 to the adjacent cooling body block 3D. A groove portion 108a for the O ring 108 is provided at an inner peripheral surface of the inlet port 332a, and a groove portion 108a for the O ring 108 is provided at a perimeter surface of the outlet port 334a.

Furthermore, the water injection port 7 for injecting the coolant water to the coolant passage 333 is provided at a surface 331b opposite to the mounting portion 331a of the cooling body unit 331.

Although the capacitor module 300 by which the respective terminals for U phase, V phase, and W phases are extracted to an outside of the case is attached to the mounting portion 331a, if an opening for attaching the capacitor module 300 is provided in a similar manner to the opening for power modules, it can cool much more effectively, and a volumetric capacity can also be appropriately changed.

Since the cooling body block (fourth unit) 3A becomes excessive, for example, when a 6-in-1 module is composed in quadrangular shape by using the cooling body blocks (first to third units) 3B to 3D, it is preferred to be used for attaching electronic components required for being cooled other than the power chip.

As the capacitor module 300, capacitors corresponding to U phase, V phase, and W phase are not only mounted, but a snubber capacitor for power modules may be mounted.

In the cross section shown in FIGS. 28A and 28B, the coolant passage 333 may be formed so that the wall thickness of the cooling body unit 331 may become uniform.

In the case of composing the three-phase AC inverter, the cooling structure 1 is configured so that the cooling devices 330B, 330C and 330D for power modules to which the power modules 100 are attached are three-dimensionally assembled so as to connect the coolant passages 333 included in the cooling devices 330B, 330C and 330D to one another.

Moreover, the cooling structure 1 further includes the cooling device 330A having the coolant passage 333 for capacitor module to which the capacitor module 300 is attached, and is configured so that the cooling device 330A for capacitor module and three cooling devices 330B, 330C and 330D for power modules are three-dimensionally assembled so as to connect the coolant passages 333 included in the cooling devices 330A, 330B, 330C and 330D to one another.

In this way, a cooling structure 1 according to the third embodiment can compose the 6-in-1 type three-phase AC inverter containing three sets of the 2-in-1 modules by using the power modules 100 attached to the cooling body blocks 3B to 3D as 2-in-1 type modules. Accordingly, as explained above, in each power module 100, the heat radiator 40 is attached thereto so that a height (ha) from a lowermost portion of the coolant passage 333 to an uppermost portion thereof and a height (hb) from the lowermost portion of the coolant passage 333 to a base edge FB is substantially identical to each other. Thereby, the power module 100 in which the heat radiator 40 is attached to the opening 335 formed at the upper surface portion of each cooling device 330B, 330C, 330D can also be efficiently cooled, and thereby it becomes possible to reduce degradation due to overheating.

In addition, since other electronic components required for thermal dissipation, e.g. the capacitor module 300, can be attached to the cooling body block 3A except for the cooling body blocks 3B to 3D, a cooling performance as the cooling structure 1 can also be remarkably improved.

According in particular to the cooling structure 1 according to the third embodiment, since the three-phase AC inverter can be arranged to space substantially equivalent to space in the case of arranging the power module apparatus 10 according to the first embodiment, significantly reduction of the arrangement area can be realized as compared with the case of being planarly arranged.

Alternatively, the power module 100A according to the first modified example can also be applied thereto instead of the power module 100.

Alternatively, in the cooling structure 1 according to the third embodiment, the cooling devices 330A, 330B, 330C and 330D may have the same configuration. For example, if the cooling structure 1 is composed by including only the cooling device 330B, the water discharge port 9 in each cooling body block 3C, 3D except for the cooling body block 3A may be sealed, and the opening 335 may be sealed in the cooling body block 3A by using the water discharge port 9 for the water injection port 7. More specifically, if the water injection port 7, the water discharge port 9, and the opening 335 are properly used in accordance with the cooling body blocks 3A to 3D to be applied, the cooling structure 1 according to the third embodiment can be composed by using the cooling devices 330B having identical shape.

Moreover, in the case of the power module 100B according to the second modified example shown in FIG. 9, it can be composed by using only the cooling device 330A.

Fourth Embodiment (Electric Vehicle)

Figure 29:
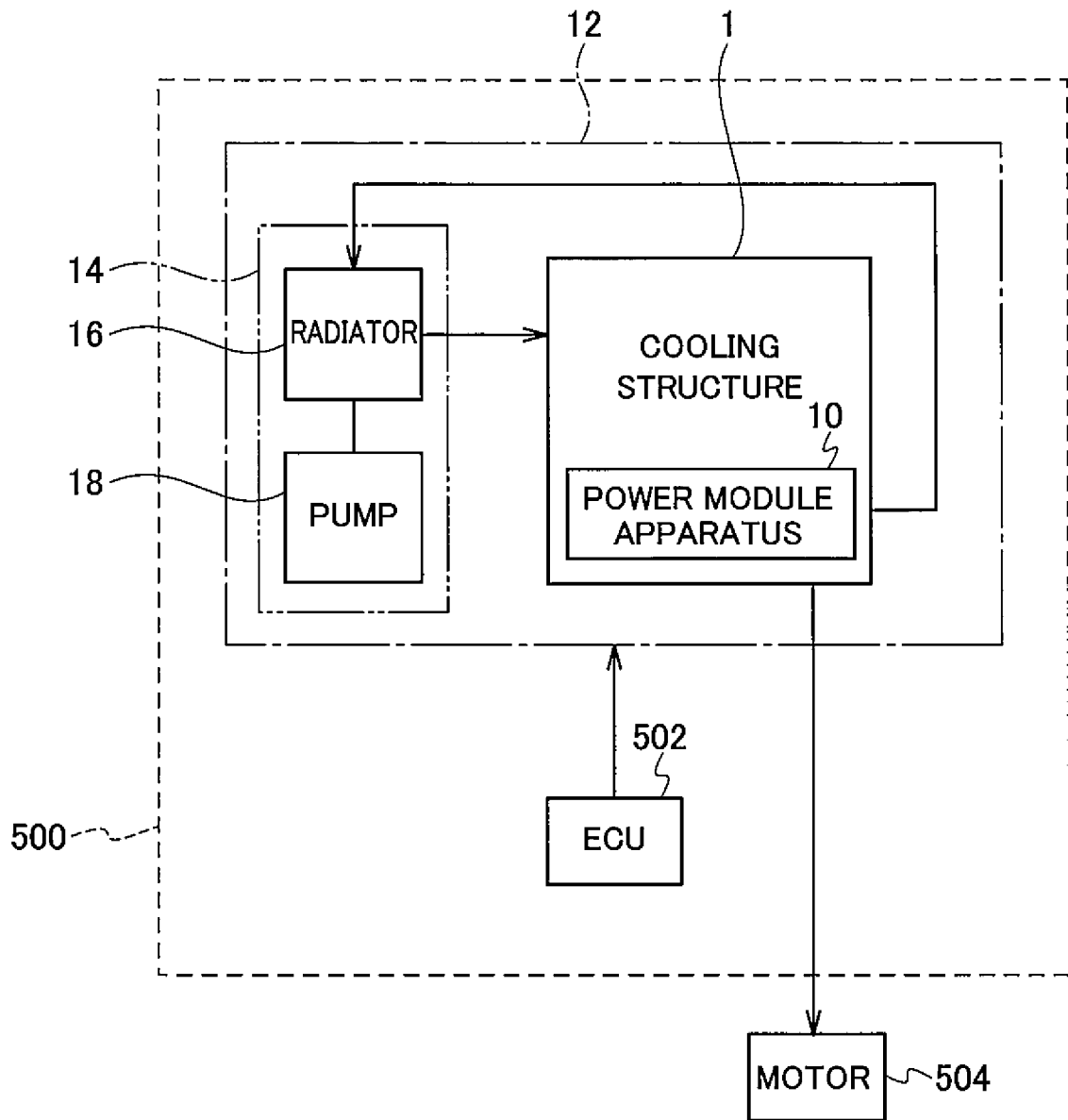
FIG. 29 is a block configuration diagram showing a principal portion of a power control unit of an electric vehicle to which a cooling structure according to a fourth embodiment is applied.

FIG. 29 shows a circuit block configuration of a cooling mechanism unit 12 including a module cooling system 14, in a cooling structure 1 applicable to a power control unit 500 of an electric vehicle according to a fourth embodiment.

As shown in FIG. 29, the cooling mechanism unit 12 applicable to the power control unit 500 of the electric vehicle according to the fourth embodiment is configured so that the cooling structure 1 composed as a three-phase AC inverter for supplying a three-phase driving current to a motor 504, for example, as a vehicle engine is cooled by means of the module cooling system 14.

In the cooling mechanism unit 12, the module cooling system 14 includes a radiator 16 and a pump 18. The radiator 16 reduces an increased temperature of a coolant water down to a certain temperature by absorbing heat by means of the cooling structure 1. The pump 18 repeatedly supplies the coolant water held at a certain temperature by means of the radiator 16 to the coolant passage 333 of the cooling structure 1.

The cooling mechanism unit 12 including such a configuration may be controlled by an Engine Control Unit (ECU) 502 configured to control a drive of the motor 504, etc., for example, in the power control unit 500 of the electric vehicle, or may be capable of always cooling the cooling structure 1 regardless of control by the ECU 502.

Figure 30:
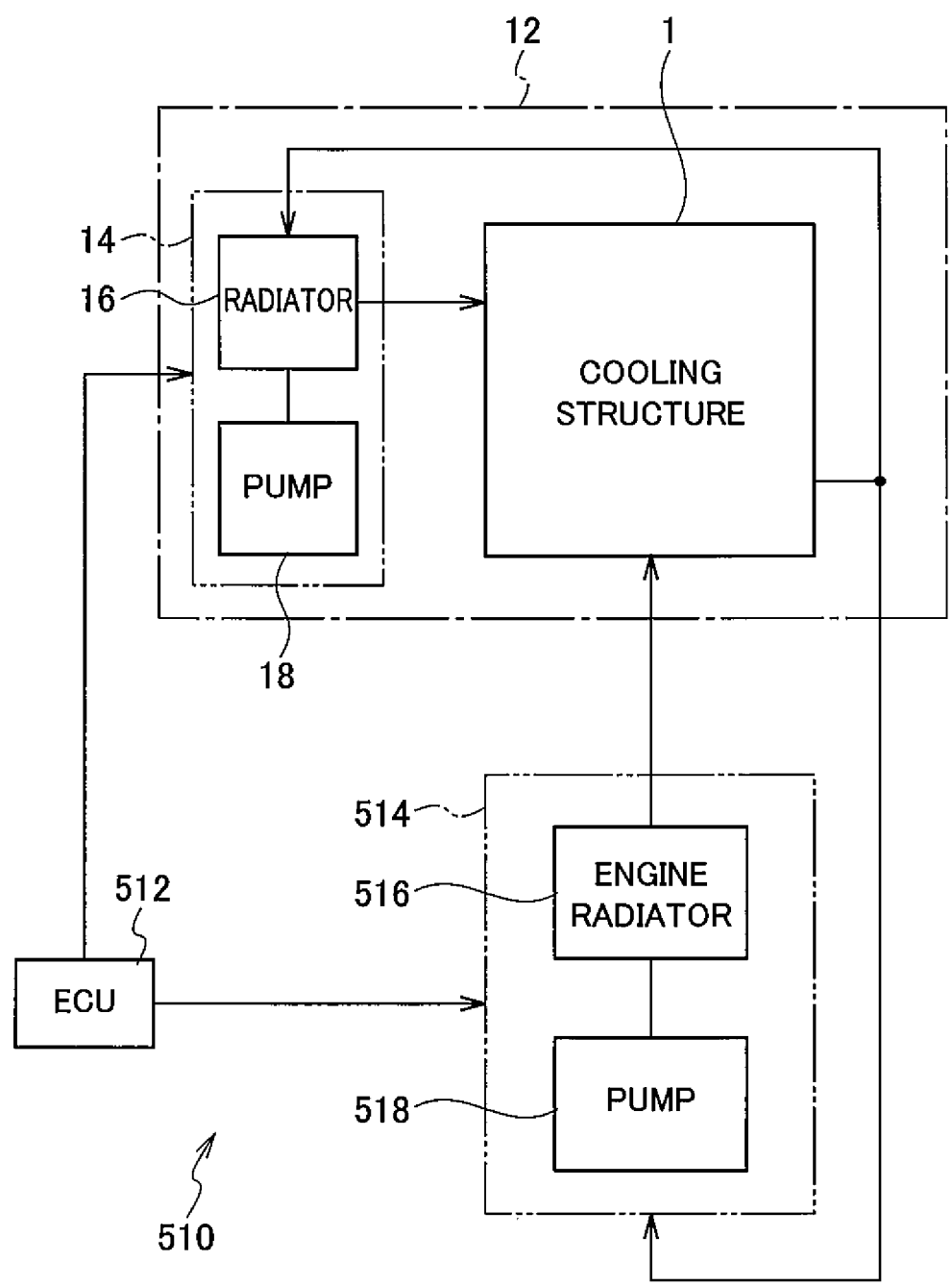
FIG. 30 is a block configuration diagram showing a principal portion of a power control unit of a hybrid electric vehicle to which the cooling structure according to the fourth embodiment is applied.

Alternatively, if the cooling mechanism unit 12 is applied to a power control unit 510 of a hybrid electric vehicle mounting not the motor 504 but a vehicle engine, as shown in FIG. 30, the cooling structure 1 may be cooled by not only the module cooling system 14 but also a hybrid-engine cooling system 514 mounted for engine cooling including an engine radiator 516 and a pump 518. In the hybrid electric vehicle configured to be capable of cooling the cooling structure 1 by means of the hybrid-engine cooling system 514, the ECU 512 can switch between cooling by means of the module cooling system 14 and cooling by means of the hybrid-engine cooling system 514, or mounting of the module cooling system 14 in the cooling mechanism unit 12 can also be omitted.

Not only the cooling structure 1 but also the power module apparatuses 10 and 10A according to each embodiment can be applied to the power control unit 500 of the electric vehicle or the power control unit 510 of the hybrid electric vehicle. However, in consideration of the arrangement to the limited space of the vehicle, applying of the cooling structure 1 capable of significantly reducing an arrangement area is effective.

As explained above, according to the embodiments, in the power module apparatus having the configuration of fitting a part of the heat radiator to the upper surface of the cooling device, interference with flow of the coolant water can be inhibited by fitting the heat radiator thereto. Accordingly, there can be provided: the power module 100 capable of suppressing that the chip is broken down due to overheating or wiring is fused; the cooling structure for implementing such a power module 100; and the electric vehicle or hybrid electric vehicle to which such a cooling structure is mounted.

In the embodiments, as the semiconductor package device applicable to the power module, as shown in FIG. 31, for example, a semiconductor package device 600 having a structure of including a plurality of output terminal electrodes O may be adopted, instead of the semiconductor package device having the structure of including three pieces of terminal electrodes P, N and O.

In the semiconductor package device 600, FIG. 31A shows a plane configuration (outer appearance structure) after forming a package 602 thereon, and FIG. 31B shows a planar pattern configuration (internal structure) before forming the package 602.

More specifically, the semiconductor package device 600 has a configuration of a module with the built-in half-bridge in which 2 pairs of a plurality of SiC MOSFETs Q1 and Q4, as shown in FIGS. 31A and 31B. FIG. 31B shows an example of four chips of the SiC MOSFETs Q1 and Q4 respectively arranged in parallel. For example, as the SiC MOSFETs Q1 and Q4, five transistors (chips) can be mounted at the maximum, and a part of the five chips can also be used for the diode DI.

The semiconductor package device 600 includes: a positive side power input terminal P (DI) and a negative side power input terminal N (S4) disposed at a first side of a ceramics substrate 604 covered with a package 602; a gate terminal (gate signal terminal electrode) GT1 and a source sense terminal (source signal terminal electrode) SST1 disposed at a second side adjacent to the first side; output terminal electrodes O (S1) and O (D4) disposed at a third side opposite to the first side; and a gate terminal GT4 and a source sense terminal SST4 disposed at a fourth side opposite to the second side.

As shown in FIG. 31B, the gate terminal GT1 and the source sense terminal SST1 are connected to the gate signal electrode pattern GL1 and the source signal electrode pattern SL1 in the SiC MOSFET Q1; and the gate terminal GT4 and the source sense terminal SST4 are connected to the gate signal electrode pattern GL4 and the source signal electrode pattern SL4 in the SiC MOSFET Q4.

From the SiC MOSFETs Q1 and Q4 toward the gate signal electrode patterns GL1 and GL4 and the source signal electrode patterns SL1 and SL4 which are respectively disposed on the signal substrates $624_1$ and $624_4$, wires for gate GW1 and GW4 and wires for source sense SSW1 and SSW4 are respectively connected. Moreover, gate terminals GT1 and GT4 and source sense terminals SST1 and SST4 for external extraction are connected to the gate signal electrode patterns GL1 and GL4 and the source sense signal electrode patterns SL1 and SL4 by soldering etc.

The sources S1 and S4 of 4 chips of the SiC MOSFETs Q1 and Q4 respectively disposed in parallel are commonly connected with the upper surface plate electrodes $622_1$ and $622_4$.

Although illustration is omitted in FIG. 31A, diodes may be respectively connected reversely in parallel between a drain DI and a source S1 and between a drain D4 and a source S4 of the SiC MOSFETs Q1 and Q4, as shown in FIG. 18 and the like.

Moreover, as the semiconductor device applicable to the power module of the power module apparatus according to the embodiments, not only the SiC system power device but also GaN-based or Si-based power devices can be adopted.

Moreover, it can be applied to not only molded-type semiconductor package devices by which resin molding is performed but also semiconductor package devices packaged with case type packages.

Moreover, it is applicable also to various power modules which contain one or more power elements.

Furthermore, when the power module is attached to the cooling device, thermal compounds, e.g. silicon, and bonding materials, e.g. a solder, can be used.

Other Embodiments

As explained above, the embodiments have been described with the modified examples, as a disclosure including associated description and drawings to be construed as illustrative, not restrictive. This disclosure makes clear a variety of alternative embodiments, working examples, and operational techniques for those skilled in the art.

Such being the case, the embodiments cover a variety of embodiments, whether described or not.

INDUSTRIAL APPLICABILITY

The power module apparatus according to the embodiments can be used for manufacturing techniques for semiconductor modules, e.g. IGBT modules, diode modules, MOS modules (Si, SiC, GaN), etc., and can be applied to wide applicable fields, e.g. inverter for Hybrid Electric Vehicle (HEV)/Electric Car (EV), inverters or converters for industry, etc.

What is claimed is:

1. A power module device comprising:
a semiconductor device configured to switch electric power;
a first terminal group connected to a power terminal or an output terminal of the semiconductor device;
a second terminal group connected to a control terminal or a sense terminal of the semiconductor device;
a sealing body configured to seal a perimeter of the semiconductor device and a part of the first terminal group and the second terminal group; and
a heat radiator bonded to a heat radiator bonded surface which is one surface side of the sealing body and having heat radiation pins or heat radiation fins protruding in a direction at the heat radiator bonded surface side, wherein
the first terminal group extends only in a first horizontal direction which is a direction parallel to the heat radiator bonded surface, and
the first terminal group extends outside an outer periphery of the heat radiation body in plan view.

2. The power module device according to claim 1, wherein the semiconductor device comprises a configuration of a module with the built-in half-bridge in which a first switching element and a second switching element are connected in series to be included as one module with a connection point between the first and second switching elements as an output.

3. The power module device according to claim 2, wherein each of the first and second switching elements is an SiC MOSFET.

4. The power module device according to claim 2, wherein the semiconductor device comprises first and second switching elements and first and second diodes respectively connected in reversely parallel to the first and second switching elements, as one module.

5. The power module device according to claim 1, wherein a gate drive circuit substrate is disposed on a surface opposite to the heat radiator bonded surface of the sealing body, and the second terminal group extends toward the gate drive circuit substrate.

6. The power module device according to claim 5, wherein the second terminal group is inserted into the gate drive circuit substrate and electrically connected to the gate drive circuit substrate.

7. The power module device according to claim 1, further comprising:
a cooling device including a coolant passage through which coolant water flows from an inlet port to an outlet port, and an opening for inserting the heat radiation pins or heat radiation fins thereinto.

8. A power module apparatus comprising:
a plurality of power module devices, each comprising:
a semiconductor device configured to switch electric power,
a first terminal group connected to a power terminal or an output terminal of the semiconductor device,
a second terminal group connected to a control terminal or a sense terminal of the semiconductor device,
a sealing body configured to seal a perimeter of the semiconductor device and a part of the first terminal group and the second terminal group, and
a heat radiator bonded a heat radiator bonded surface which is one surface side of the sealing body and having heat radiation pins or heat radiation fins protruding in a direction opposite to the sealing body from the heat radiator bonded surface; and
a cooling device including a coolant passage through which coolant water flows from an inlet port to an outlet port, and a plurality of openings for respectively inserting the heat radiation pins or heat radiation fins of the plurality of power module devices thereinto, the openings each provided on a way of the coolant passage, the plurality of openings being arranged along a longitudinal direction of the coolant passage, wherein
the heat radiation pins or heat radiation fins of the plurality of power module devices are respectively inserted in the coolant passage through the plurality of openings, and
the first terminal groups of the plurality of power module devices extend in a direction orthogonal to an arrangement direction of the plurality of power module devices, and also extend outward rather than an outer periphery of the heat radiation body in plan view.

9. The power module apparatus according to claim 8, wherein in each of the plurality of power module devices, the semiconductor device comprises first and second switching elements and first and second diodes respectively connected in reversely parallel to the first and second switching elements, as one module.

10. The power module apparatus according to claim 9, wherein each of the first and second switching elements is an SiC MOSFET.

11. The power module apparatus according to claim 8, wherein the direction orthogonal to the arrangement direction of the plurality of power module devices is a non-longitudinal direction of the cooling device, and the second terminal group extends in the arrangement direction.

12. The power module device according to claim 1, wherein the first terminal group extends only in a first horizontal direction but does not extend in vertical direction orthogonal to the first horizontal direction.

13. The power module apparatus according to claim 8, wherein the first terminal groups each extends only in a first horizontal direction but does not extend in vertical direction orthogonal to the first horizontal direction.

14. The power module apparatus according to claim 8, wherein, in each of the plurality of power module devices:
a gate drive circuit substrate is disposed on a surface opposite to the heat radiator bonded surface of the sealing body, and the second terminal group extends toward the gate drive circuit substrate, and the second terminal group is inserted into the gate drive circuit substrate, and
the second terminal group extends toward the gate drive circuit substrate.

15. The power module device according to claim 5, wherein the second terminal group extends from the sealing body in a second direction perpendicular to the first direction in which the first terminal group extends from the sealing body, and then extends toward the gate drive circuit substrate.

16. The power module apparatus according to claim 8, wherein, in each of the plurality of power module devices, the second terminal group extends from the sealing body in a second direction perpendicular to the first direction in which the first terminal group extends from the sealing body, and then extends toward the gate drive circuit substrate.

17. The power module device according to claim 1, wherein a watertight element is disposed on a periphery of the opening of the cooling device so as to surround the periphery.

18. The power module device according to claim 17, wherein a groove portion for fixing the watertight element is formed in the periphery of the opening.

19. The power module device according to claim 2, wherein, among the first terminal group, a terminal electrically connected to the power terminal and a terminal electrically connected to the output are extended from the sealing body in opposite directions to each other.

20. The power module device according to claim 1, wherein a height of a portion of the first terminal group protruding from the sealing body and a height of the portion of the second terminal group protruding from the sealing body, viewed in a thickness direction, are different from each other.

21. The power module device according to claim 1, wherein a height of a tip at an extended side of the first terminal group, viewed in a thickness direction, is lower than a height of the sealing body.

* * * * *